(12) United States Patent
Saito

(10) Patent No.: US 7,180,452 B2
(45) Date of Patent: Feb. 20, 2007

(54) PORTABLE RADIO APPARATUS

(75) Inventor: Tetsuya Saito, Saitama (JP)

(73) Assignee: NEC Corporation, Tokyo (JP)

( * ) Notice: Subject to any disclaimer, the term of this patent is extended or adjusted under 35 U.S.C. 154(b) by 120 days.

(21) Appl. No.: 10/895,327

(22) Filed: Jul. 21, 2004

(65) Prior Publication Data

US 2005/0024288 A1   Feb. 3, 2005

(30) Foreign Application Priority Data

Jul. 28, 2003   (JP)   ............................. 2003-281346

(51) Int. Cl.
*H01Q 1/24*   (2006.01)
*H01Q 1/36*   (2006.01)

(52) U.S. Cl. ...................... 343/702; 343/895

(58) Field of Classification Search ............... 343/702, 343/906, 895, 900, 725, 727; 340/540, 572
See application file for complete search history.

(56) References Cited

U.S. PATENT DOCUMENTS

| | | | | |
|---|---|---|---|---|
| 4,712,112 A * | 12/1987 | Carr | ........................... | 343/788 |
| 4,763,087 A | 8/1988 | Schrader | ...................... | 333/101 |
| 6,043,780 A * | 3/2000 | Funk et al. | .................. | 343/702 |
| 6,057,807 A * | 5/2000 | Marthinsson et al. | ........ | 343/895 |
| 6,067,052 A * | 5/2000 | Rawles et al. | ............... | 343/741 |
| 6,680,713 B2 * | 1/2004 | Yokoshima et al. | ......... | 343/895 |
| 6,825,818 B2 * | 11/2004 | Toncich | ....................... | 343/860 |
| 2002/0011932 A1* | 1/2002 | Rodgers et al. | .......... | 340/572.1 |
| 2003/0189520 A1* | 10/2003 | Goto et al. | .................. | 343/702 |
| 2004/0012530 A1* | 1/2004 | Chen | ........................... | 343/702 |
| 2004/0207565 A1* | 10/2004 | Hibino et al. | ............... | 343/860 |
| 2004/0257283 A1* | 12/2004 | Asano et al. | ............... | 343/702 |

FOREIGN PATENT DOCUMENTS

| | | |
|---|---|---|
| JP | 63-102512 | 5/1988 |
| JP | 1-298804 | 12/1989 |
| JP | 4-58603 | 2/1992 |
| JP | 5-206888 | 8/1993 |
| JP | 6-53720 | 2/1994 |
| JP | 9-307331 | 11/1997 |
| JP | 11-289214 | 10/1999 |
| JP | 2001-119239 | 4/2001 |

(Continued)

OTHER PUBLICATIONS

European Search Report dated Jul. 26, 2005.

(Continued)

*Primary Examiner*—Hoanganh Le
*Assistant Examiner*—Tung Le
(74) *Attorney, Agent, or Firm*—Whitham, Curtis, Christofferson & Cook, PC

(57) ABSTRACT

A portable radio apparatus capable of providing an impedance match with an antenna and a simple matching circuit for all frequency components of a frequency band to be used. A portable radio apparatus includes a whip antenna, a matching circuit, a radio section changing switch, a first frequency band receiver, and a first frequency band transmitter. A parallel inductor causing a resonance with a frequency lower than a resonance frequency of the antenna is connected in parallel to the antenna for a two-resonance characteristic to thereby conduct a wide-band operation.

47 Claims, 18 Drawing Sheets

FOREIGN PATENT DOCUMENTS

| | | |
|---|---|---|
| JP | 2001-320292 | 11/2001 |
| JP | 2002-76750 | 3/2002 |
| JP | 2003-60416 | 2/2003 |
| JP | 2004-200941 | 7/2004 |
| WO | WO 01/97323 | 12/2001 |

OTHER PUBLICATIONS

Japanese Office dated Feb. 7, 2006 with English translation of pertinent portions.

* cited by examiner

RELATIONSHIP BETWEEN CABINET LENGTH AND BAND WIDTH (RL=−10dB)

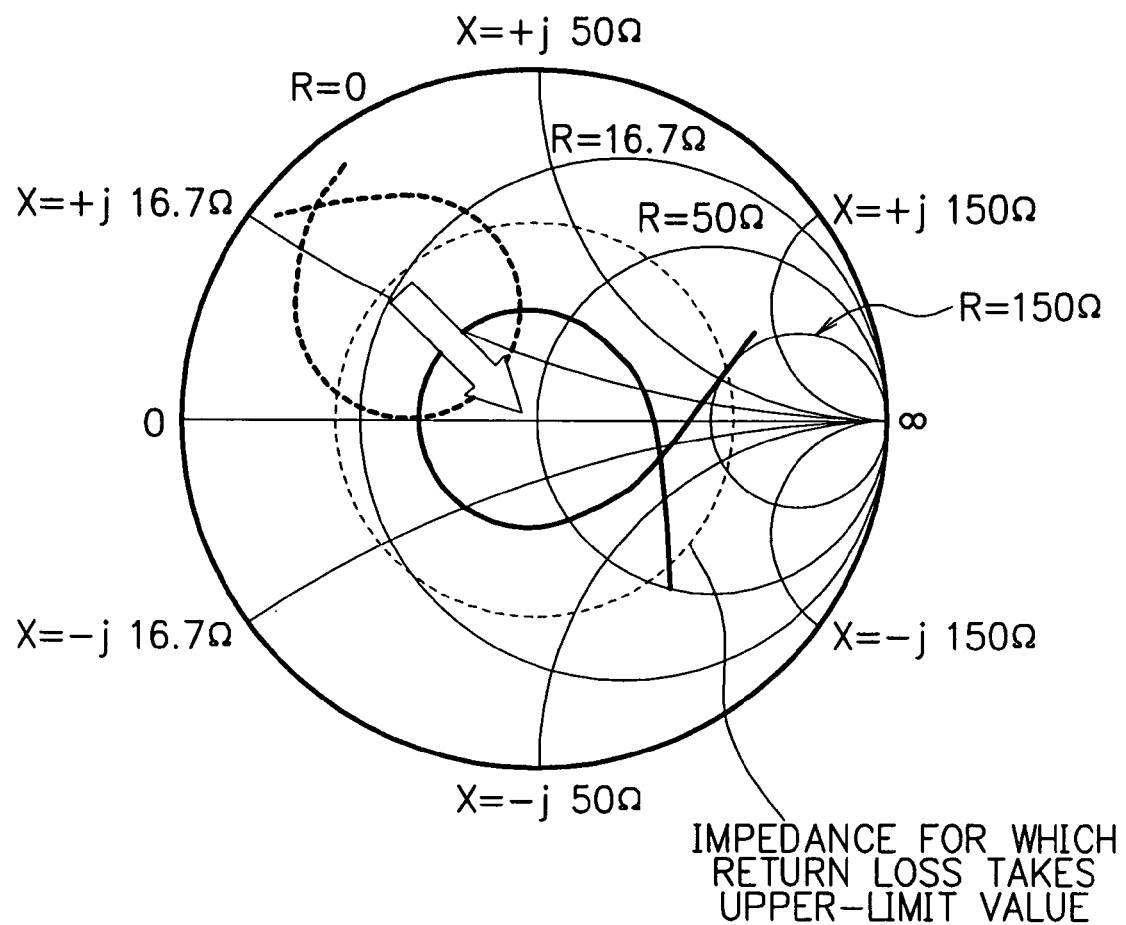
F I G. 6

F I G. 7
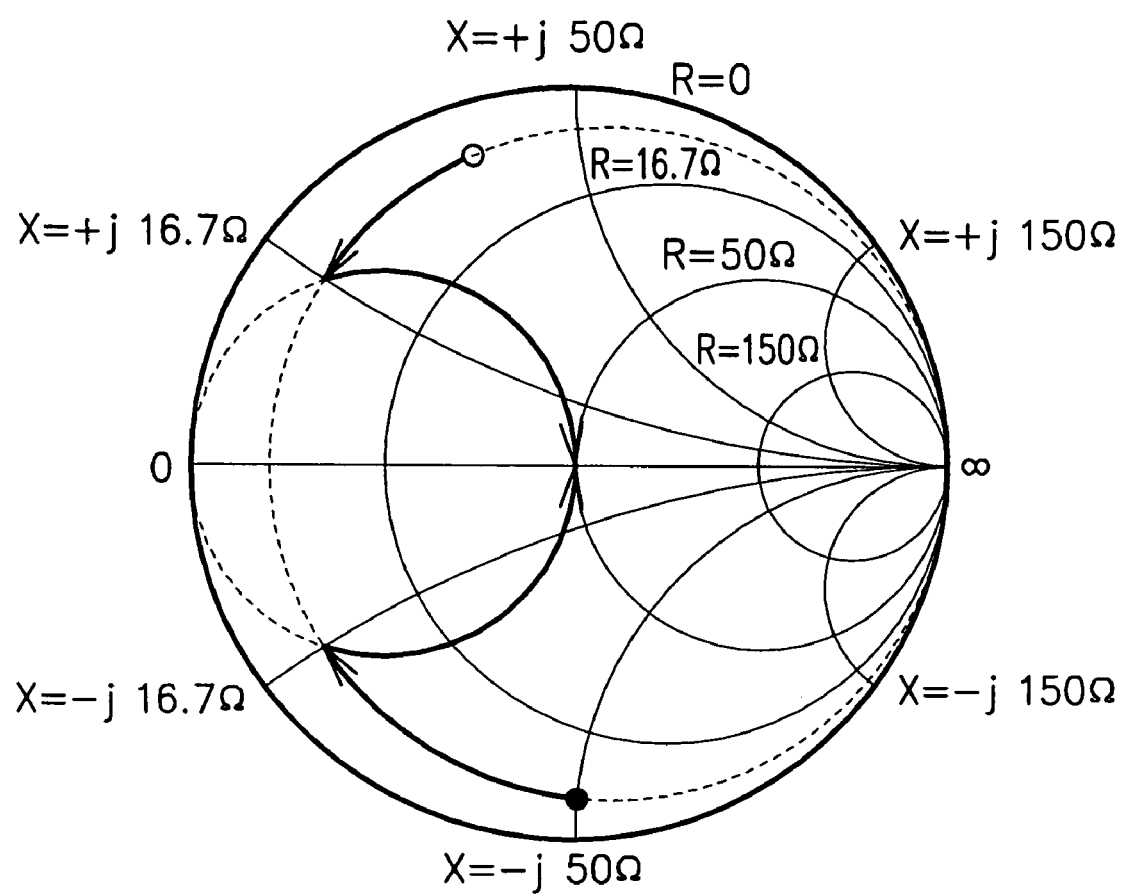

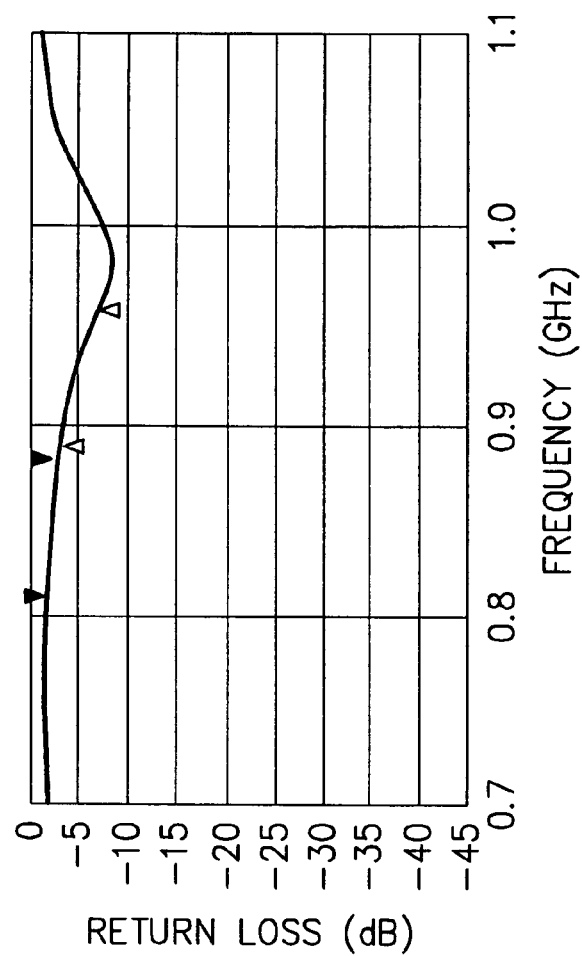
F I G. 9B
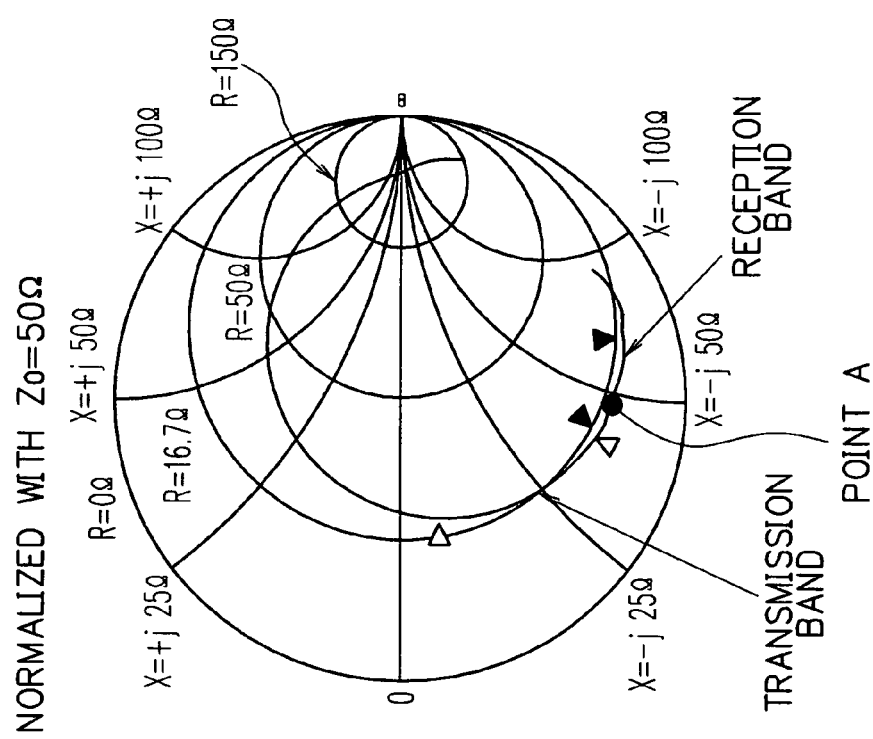
F I G. 9A

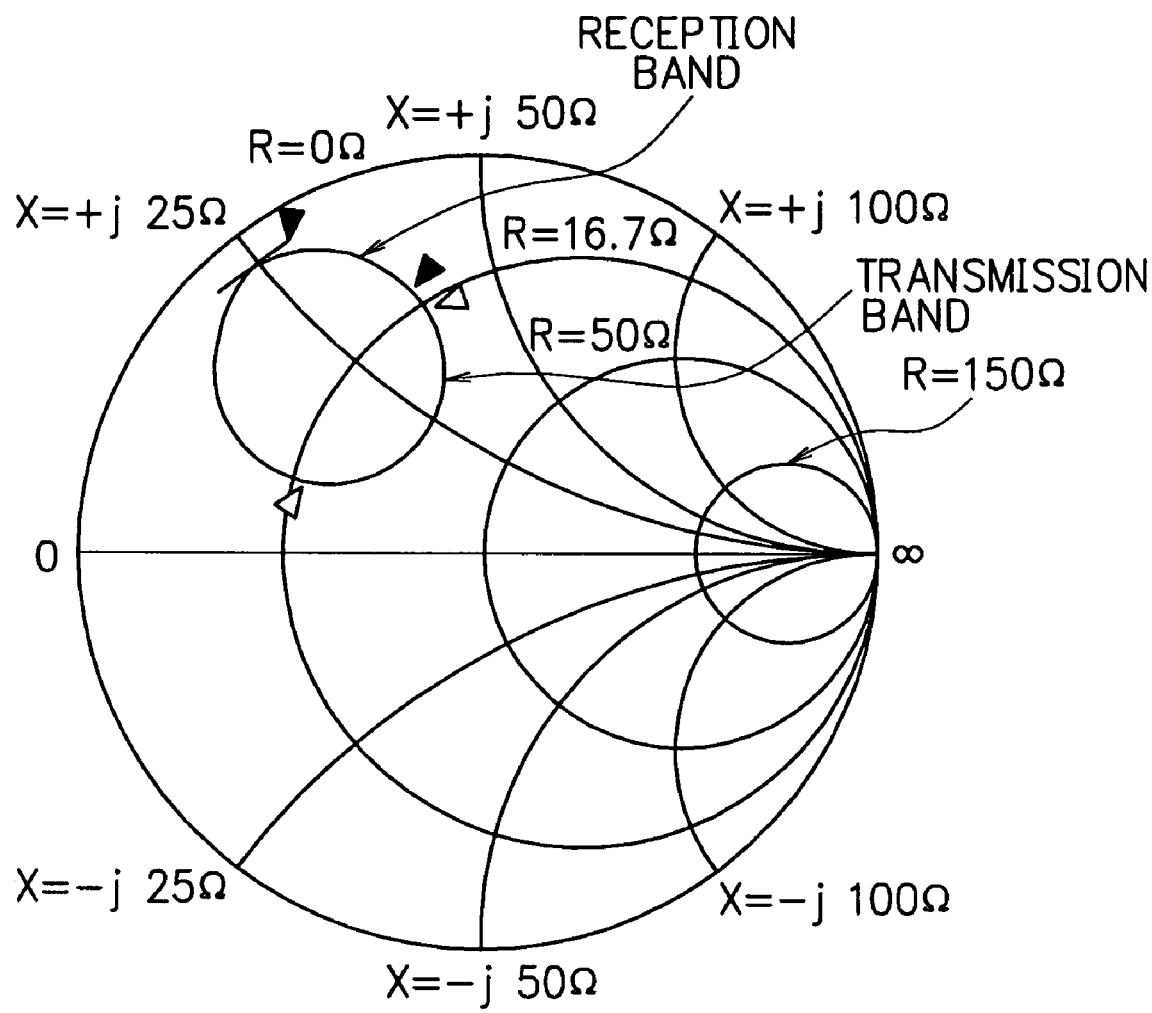
F I G. 10

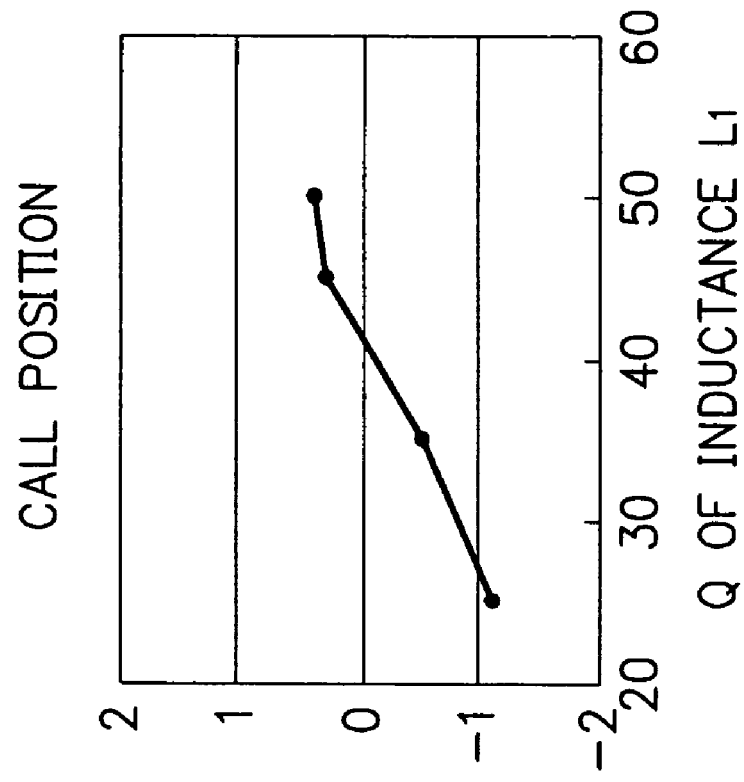
F I G. 12A
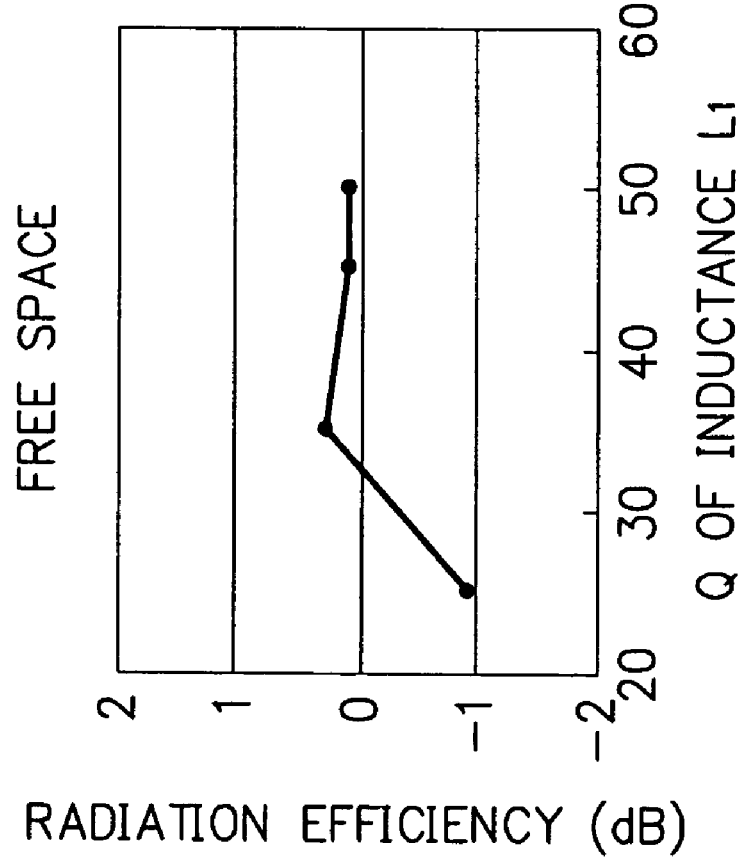
F I G. 12B

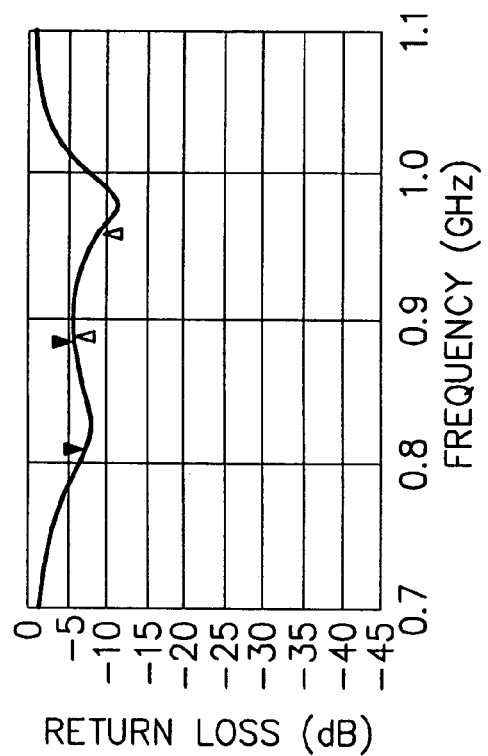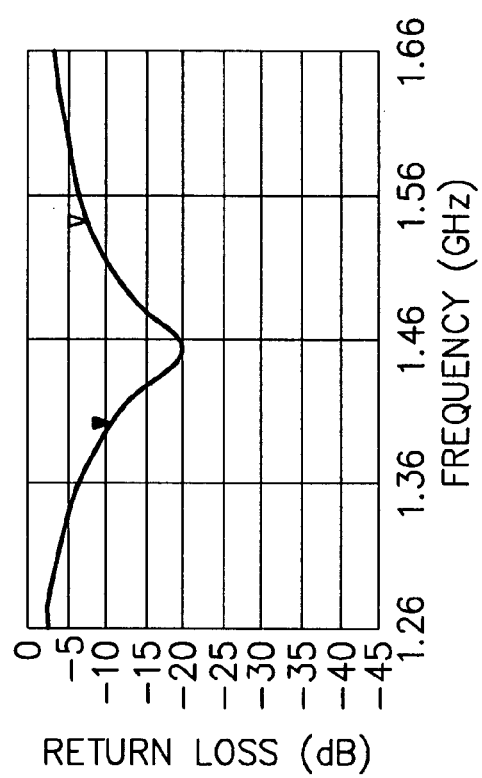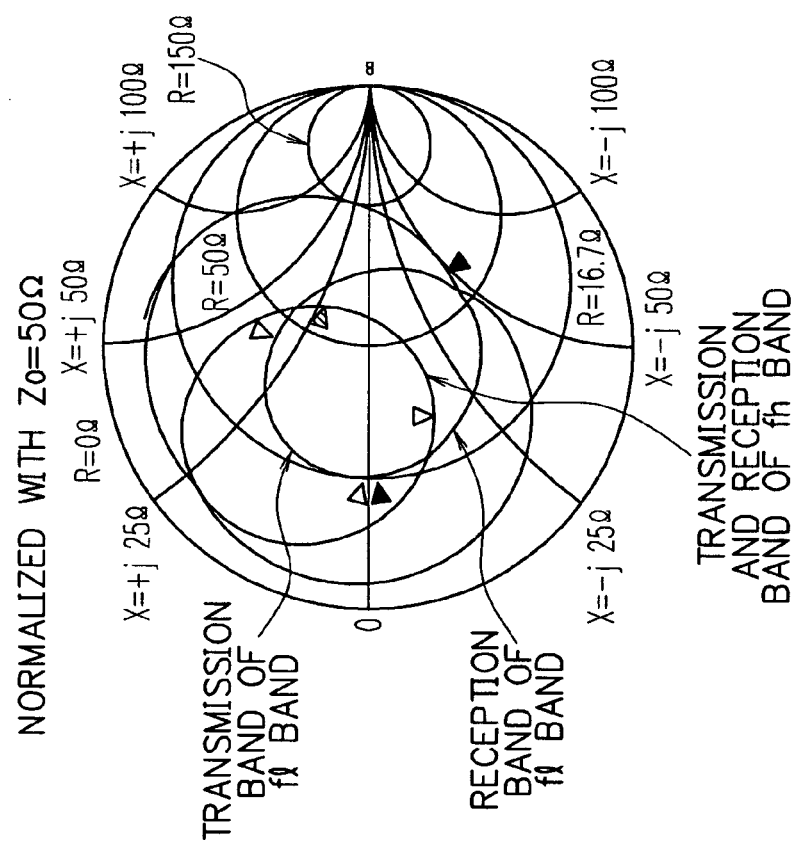

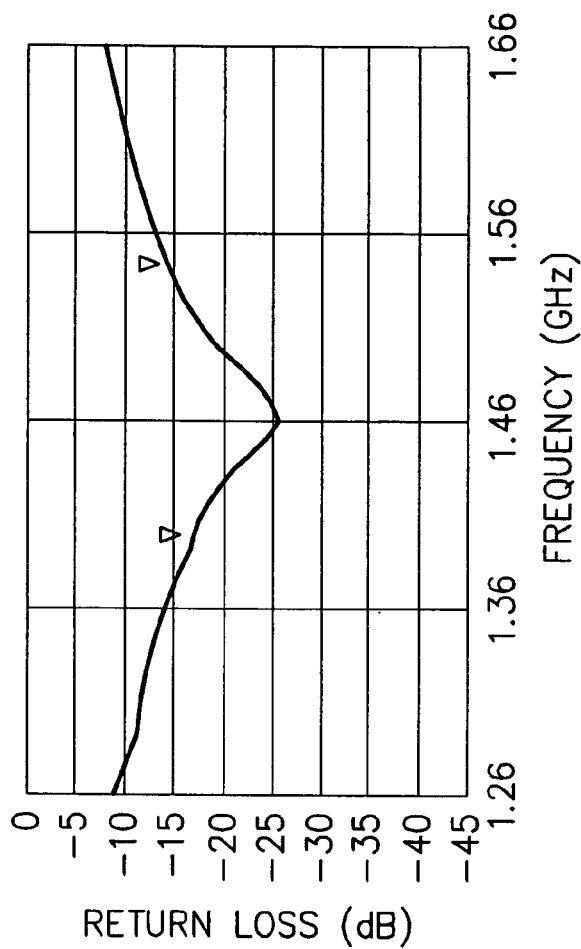
F I G. 18B
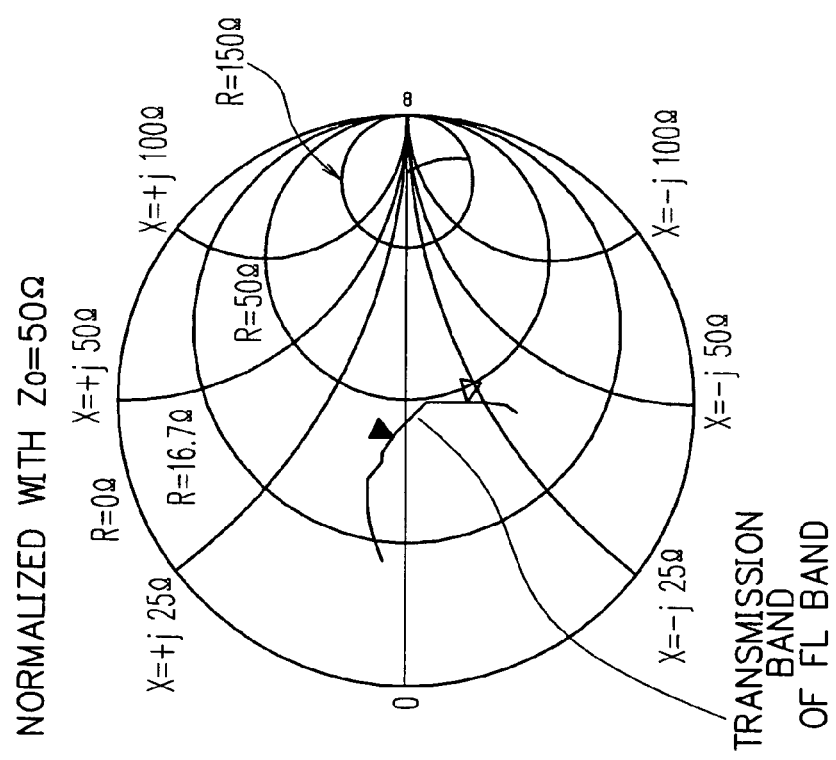
F I G. 18A

PORTABLE RADIO APPARATUS

BACKGROUND OF THE INVENTION

The present invention relates to a portable radio apparatus, and in particular, to a portable radio apparatus capable of providing an impedance match by use of an antenna and a matching circuit having a simple configuration for all frequency components in a frequency band to be used.

Description of the Prior Art

In a personal digital cellular (PDC) system as a Japanese standard system and in a global system for mobile communications (GSM) as a standard system in Europe, time division multiple access (TDMA), in which each station sends or receives signals only using a particular time slot allocated thereto, is employed to improve efficiency of frequency utilization.

In the PDC system, different frequency bands are assigned respectively to an up communication and a down communication to thereby multiplex communications. A frequency band ranging from 810 MHz to 885 MHz is allocated to the down communication, and a frequency band ranging from 885 MHz to 960 MHz is allocated to the up communication. In the GSM system, a frequency band of 935 MHz to 960 MHz is allocated to the down communication, while a frequency band of 890 MHz to 915 MHz is allocated to the up communication.

With increase in the capacity of contents communicated via wireless communication in the future, it will be required to increase the transmission speed. It is hence considered to be necessary depending on cases that a duplex function is installed to increase the transmission speed using all receiving slots in data communication.

In the duplex communication, transmission and reception are required to be carried out at the same time. Therefore, it is necessary for a portable radio apparatus having the duplex function to include an antenna covering a frequency band for up communication and a frequency band for down communication.

It has been well known that a portable radio apparatus today such as a portable telephone, a radio apparatus including a communicating function, or a personal digital assistant (PDA) including a communicating function has an antenna characteristic which is remarkably influenced by the length of a casing or a cabinet thereof.

FIG. 1 shows a relationship between the cabinet length of a portable radio apparatus and the antenna characteristic thereof. In the antenna characteristic, a bandwidth is plotted while the cabinet length is changed such that the return loss is equal to or less than −10 dB when an optimal matching circuit is used. The ordinate indicates a fractional bandwidth (%) of the antenna, and the abscissa denotes a ratio (L/λ) between the cabinet length (L) and wavelength (λ). In this example, it is assumed for calculation that the cabinet length is equal to about 0.14λ and the antenna is a helical antenna with a height of about 0.045λ.

In the present market, a holding type portable telephone (which can be folded at a hinge section) and a portable telephone the cabinet length of which can be elongated by rotating or drawing out two cabinet sections are in widespread use. In such a telephone, the cabinet length in the elongated state is about 0.2 m in general. The length corresponds to 0.54λ to 0.6 λ in the 800 MHz band. As can be seen from FIG. 1, the bandwidth of the antenna is about 5.6% in this situation.

In the 800 MHz band communication, the PDC system uses about 11% of the band, while the GSM system employs about 8% to 9% of that. Therefore, regardless of whether the PDC or GSM system is adopted, the existing portable telephone having an antenna bandwidth of about a little under 6% cannot secure a sufficient band. In other words, the antenna element of the telephone effectively functions only for part of frequency components of the frequency band used in the PDC or GSM system.

As just described, when the duplex function is added to the conventional portable radio apparatus, there arises a problem of the narrow bandwidth of the antenna.

The portable radio device of the prior art cannot enlarge the antenna bandwidth because the matching circuit thereof can only match with the antenna in a narrow frequency band. That is, a matching circuit for transmission matches with the antenna only in a frequency band for the up communication, and a matching circuit for reception matches with the antenna only in a frequency band for the down communication.

Therefore, the conventional portable radio apparatus includes matching circuits respectively optimal for different frequency bands, and implements the duplex function by selecting therefrom a matching circuit appropriate for a frequency band to be used. FIG. 2 shows a configuration of a radio apparatus of this type. The apparatus includes a parallel resonance circuit for duplex transmission 5, a TDMA transmission circuit 19, and a TDMA reception circuit 20. These circuits are connected respectively via switches 3, 16, and 17 to respective points between a matching circuit 2 and a radio section change-over switch 7.

The circuit 5 is used at packet transmission and is hence hardly used on the side of the human head. Therefore, the circuit 5 has constants adjusted so as to simultaneously cover the transmission and reception bands in a free space.

In a call using voices and sounds, the portable radio apparatus conducts communication using the TDMA system and hence is employed on the human head side. When the duplex transmission circuit 5 is used in the TDMA communication, the matched state becomes worse on the human head side and hence the antenna characteristic is also deteriorated. To overcome this problem, the TDMA transmission circuit 19 is adjusted such that, whether used in the free space or on the human head side, the transmission band only is in an optimal matched state.

The operation of the apparatus will now be described. In communication employing the duplex function, the switch 3 is closed and the other switches are opened. Thereby, only the parallel resonance circuit 5 operates to cover the transmission and reception bands at the same time.

In the TDMA communication, the TDMA transmission circuit 19 and the TDMA reception circuit 20 are operated according to control signals respectively synchronized with transmission timing and reception timing. In this situation, the circuit 5 and a 1.5 MHz circuit 21 are separated from the antenna 1 respectively by the switches 3 and 18. Therefore, in the state of the audio call, a satisfactory characteristic can be attained in both the transmission and reception bands.

In the portable radio apparatus, the duplex function can be implemented in the 800 MHz band. However, the change-over operation is required to select an appropriate matching circuit according to the communication system. This leads to a problem that the circuit configuration becomes complex and the number of parts increases. In association with the increase in the circuit size and complexity of the circuit, the loss in the matching circuit increases and hence the radiation efficiency is deteriorated.

Since the apparatus also requires switches for respective communication systems, the apparatus consumes larger amounts of power. Moreover, a logical circuit to control each of the switches is also increased in size. This results in a problem of a larger mounting area of each matching circuit.

Japanese Patent Application laid open No. 9-307331 entitled "A Matching Circuit and An Antenna Device Using the Same" describes an antenna device for a radio apparatus communicating signals of frequencies in a wide range without conducting a change-over operation between matching circuits.

However, according to the invention disclosed in the above patent application, a resonance frequency of a matching circuit is adjusted with a variable condenser or capacitor and hence there is additionally required a control circuit to change the capacity of the condenser. Therefore, since the circuit size of the matching circuit cannot be reduced, the matching circuit loss becomes larger as in the above-described prior art carrying out a changeover between matching circuits, and hence the radiation efficiency is lowered.

Besides, in portable telephones, a kind of the portable radio apparatuses of today, the call channels become insufficient due to increase in the number of subscribers when only the 800 MHz band is used as before. Therefore, it has been advised that users subscribe in communication services provided with the use of electromagnetic waves in the 1.5 GHz band, 1.9 GHz band, or a higher frequency band.

This has resulted in the development of a portable radio apparatus called "dual band apparatus" so that one portable telephone can use two frequency bands. The dual band apparatus is configured to operate using the 800 MHz band and 1.5 GHz band (nearly double the 800 MHz band) or using the 800 MHz and 1.9 GHz.

The dual band apparatus is required to be configured such that a radio circuit to convert a radio signal into an electric signal can operate with two frequency bands and an antenna and a matching circuit to receive a radio signal function in both frequency bands.

However, the conventional portable radio apparatus cannot cover all frequency components of the 800 MHz band with only one matching circuit as described above. To conduct a dual band operation with 800 MHz and 1.5 GHz, it is required that the conventional apparatus using only the 800 MHz band shown in FIG. 2 further includes a matching circuit (1.5 GHz band matching circuit 21) to communicate information through the 1.5 GHz band, a circuit (second frequency band receiver circuit 14) to receive a radio signal in the 1.5 GHz band, a circuit (second frequency band transmitter circuit 15) to send a signal in the 1.5 GHz band, and switches (switches 7c, 11, and 18) to conduct a change-over operation between them as shown in FIG. 3. In the configuration, a control circuit 6 is required to appropriately carry out a changeover in the switches according to a communication system to be used.

In this case, the circuit size becomes greater as compared with the portable radio apparatus using only the 800 MHz band, and hence the loss by the matching circuit and the deterioration in the radiation characteristic appear more strongly.

SUMMARY OF THE INVENTION

It is therefore an object of the present invention to provide a portable radio apparatus capable of providing an impedance match by use of an antenna and a matching circuit having a simple configuration for all frequency components in a frequency band to be used.

In accordance with the first aspect of the present invention, to achieve the object mentioned above, there is provided a portable radio apparatus including an antenna for transmitting and receiving a radio signal, a radio circuit for decoding the radio signal received via the antenna and encoding a signal to be transmitted as a radio signal via the antenna, and a matching circuit for providing an impedance match between the antenna and the radio circuit. The matching circuit includes one or more inductive elements connected in parallel to the antenna. At least one of the inductive elements has a Q factor more than a predetermined value, the Q factor being expressed as:

$$Q = \omega L/R \qquad (1)$$

wherein, R indicates a resistance component, L is an inductance component, and $\omega$ designates an angular frequency of the radio signal.

In the configuration, it is favorable that the antenna to communicate radio signals in a predetermined frequency band has a series resonance frequency in the vicinity of an upper limit of the frequency band. The matching circuit favorably causes a parallel resonance in the neighborhood of a lower limit of the predetermined frequency band in association with one of the inductive elements connected in parallel with the antenna. It is desirable that the radio signal fed via the matching circuit to the antenna has a reflection loss equal to or less than a predetermined value such as −5 decibel or, more favorably, −10 decibel. One of the inductive elements favorably has the Q factor value which makes the radiation efficiency of the antenna be equal to or less than a predetermined value at transmission of radio signals.

In the configuration, the matching circuit is a π type circuit in which a first inductive element is connected in parallel on the side of the antenna and a second inductive element is connected in parallel on the side of the radio circuit. The first inductive element desirably has a Q factor more than that of the second inductive element.

Additionally, it is favorable that the Q factor value of the first inductive element is a value which makes the radiation efficiency of the antenna be equal to or more than a predetermined value at transmission of radio signals, or the Q factor values respectively of the first and second inductive elements are values which make the radiation efficiency of the antenna be equal to or more than a predetermined value at transmission of radio signals.

In any configuration of the first aspect of the present invention, the Q factor value of the inductive element is favorably 40 or more.

In accordance with the second aspect of the present invention, to achieve the object, there is provided a portable radio apparatus including an antenna for transmitting and receiving a radio signal, a radio circuit for decoding the radio signal received via the antenna and encoding a signal to be transmitted as a radio signal via the antenna, and a matching circuit for providing an impedance match between the antenna and the radio circuit. The matching circuit includes at least one capacitive element connected in parallel to the antenna. In the configuration, it is favorable that the antenna to communicate radio signals in a predetermined frequency band has a series resonance frequency in the vicinity of a lower limit of the frequency band. The matching circuit favorably causes a parallel resonance in the neighborhood of an upper limit of the predetermined frequency band in association with one of the capacitive elements connected in parallel with the antenna. It is also desirable that the radio signal delivered via the matching circuit to the antenna has a reflection loss equal to or less than a predetermined value such as −5 decibel or, more favorably, −10 decibel.

In accordance with the second aspect of the present invention, the matching circuit is favorably a π type circuit in which a first capacitive element is connected on the antenna side in parallel with the antenna and a second capacitive element is connected on the radio circuit side in parallel with the antenna.

In both the configurations according to the present invention, it is favorable that the radio circuit is a circuit to conduct encoding and decoding of radio signals in a plurality of frequency bands and the antenna has two different resonance frequencies in one of the frequency bands. The antenna desirably includes a straight section and a helical section, and the helical section has a two-resonance characteristic. It is also desirable that the antenna is constructed as an expandable and contractible unit including a unit to detect whether or not the antenna is in an expanded state and an expansion matching circuit for use in the expanded state. When connected to the matching circuit, the expansion matching circuit matches impedance with the antenna in an expanded state in a particular frequency band. When the antenna is in the expanded state and a particular one of the frequency bands is selected, the expansion matching circuit is favorably linked with the matching circuit. In a frequency band in which the expansion matching circuit is not coupled with the matching circuit, the expanded antenna desirably matches impedance with the matching circuit.

In accordance with the present invention, there is provided a portable radio apparatus capable of providing an impedance match by use of an antenna and a matching circuit having a simple configuration for all frequency components in a frequency band to be used.

BRIEF DESCRIPTION OF THE DRAWINGS

The objects and features of the present invention will become more apparent from the consideration of the following detailed description taken in conjunction with the accompanying drawings in which:

FIG. 6 is a Smith chart showing a state in which an impedance match is provided between a matching circuit and an antenna;

FIG. 7 is a Smith chart showing a specific example in which an impedance match is provided by a combination of an inductor component and a capacitor component of elements connected to an antenna;

FIG. 9A is a Smith chart showing input impedance of a whip antenna itself;

FIG. 9B is a graph showing a relationship between a return loss of an antenna and a frequency in the state of FIG. 9A;

FIG. 10 is a Smith chart showing input impedance of a whip antenna when inductance $L_1$ is arranged in parallel with the antenna;

FIG. 12A is a graph showing a relationship between the Q factor value of inductance and radiation efficiency in a free space;

FIG. 12B is a graph showing a relationship between the Q factor value of inductance and radiation efficiency at a call position at which a voice call is conducted;

FIG. 16A is a Smith chart showing input impedance of a contracted two-resonance antenna with matched impedance;

FIG. 16B is a graph showing a relationship between a return loss of the contracted antenna with matched impedance and a frequency in a lower frequency band;

FIG. 16C is a graph showing a relationship between a return loss of the contracted antenna with matched impedance and a frequency in a higher frequency band;

FIG. 18A is a Smith chart showing input impedance of an expanded two-resonance antenna with matched impedance in a higher frequency band; and FIG. 18B is a graph showing a relationship between a return loss of the expanded antenna with matched impedance and a frequency in a higher frequency band.

DESCRIPTION OF THE EMBODIMENTS

Principle of Invention

Description will now be given of a principle of the present invention. Although a Smith chart normalized with $Z_0$=50 Ω is used to explain the principle, the chart is only an example, and the present invention is applicable regardless of the value of $Z_0$.

A state in which an impedance match is provided between an antenna and a matching circuit is a state in which a return loss represented by a ratio ($P_2/P_1$) between power $P_1$ of a signal received by the antenna via the matching circuit and power $P_2$ of a signal reflected by the antenna is less than a predetermined level.

When input impedance of the antenna (impedance when the antenna is viewed via the matching circuit) is plotted on a Smith chart, impedance matches more favorably between the antenna and the matching circuit as the input impedance value is nearer to $R=Z_0$ and $Z=0$. When the return loss takes the same value, the impedance is represented as a circular arc centered on $R=Z_0$ and $Z=0$.

Therefore, to expand the bandwidth of the antenna is equivalent to the increase in the frequency components in a circle with a prescribed radius centered on $R=Z_0$ and $Z=0$ when the input impedance of the antenna is drawn on the Smith chart. $Z_0$ indicates a characteristic impedance of the antenna. For all frequency components of a frequency band to be used, when the input impedance of the antenna is within a circle which is centered on $R=Z_0$ and $Z=0$ and in which the return loss is an upper-limit value, the antenna and the matching circuit can cover the frequency components of the frequency band.

In accordance with the present invention, an inductor $L_1$ is arranged in parallel with an antenna having a resonance frequency $f_1$ in the proximity of an upper limit of a frequency band to be used. The inductor $L_1$ has inductance of a value for a parallel circuit including the antenna and the inductor $L_1$ to cause resonance with a frequency $f_2$ in the vicinity of a lower limit of the frequency band.

Figure 1:
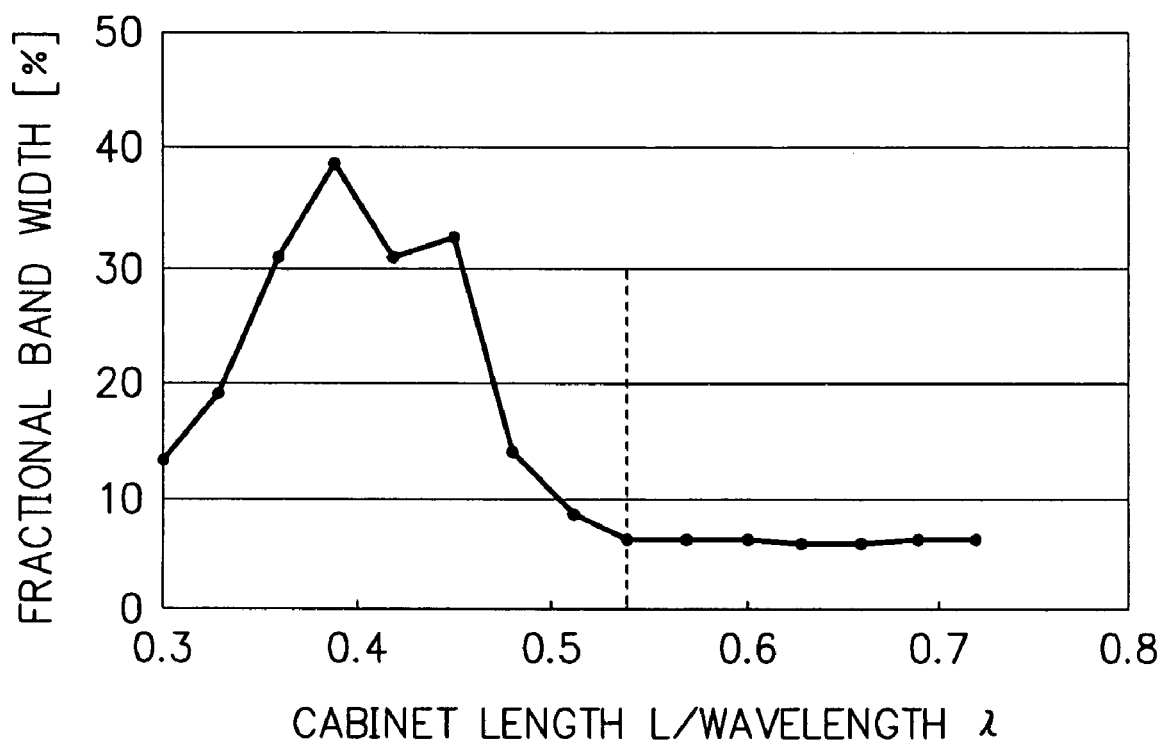
FIG. 1 is a graph showing a relationship between a cabinet length and a bandwidth.
Figure 2:
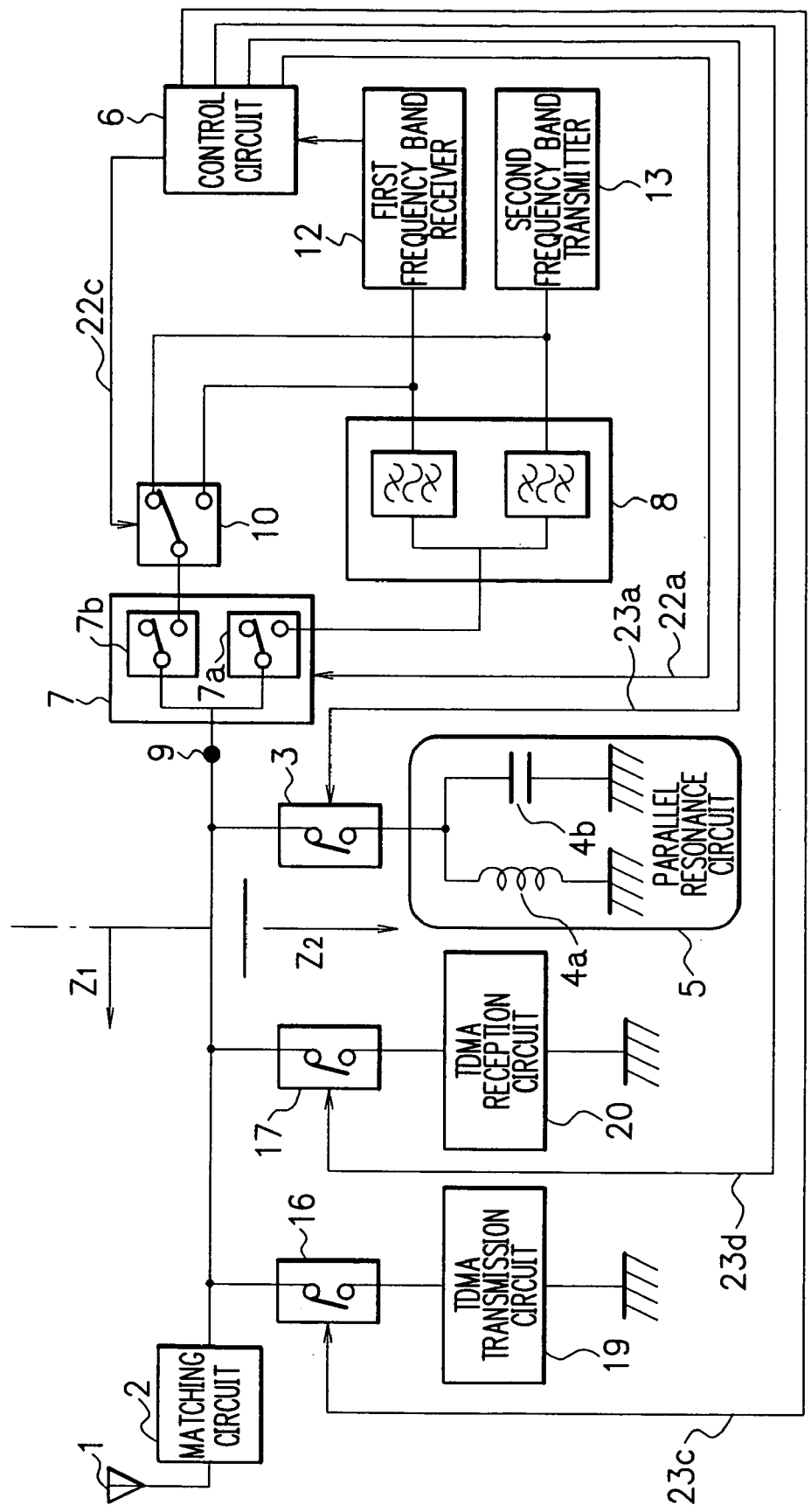
FIG. 2 is a diagram showing a configuration of a portable radio apparatus of the prior art.
Figure 3:
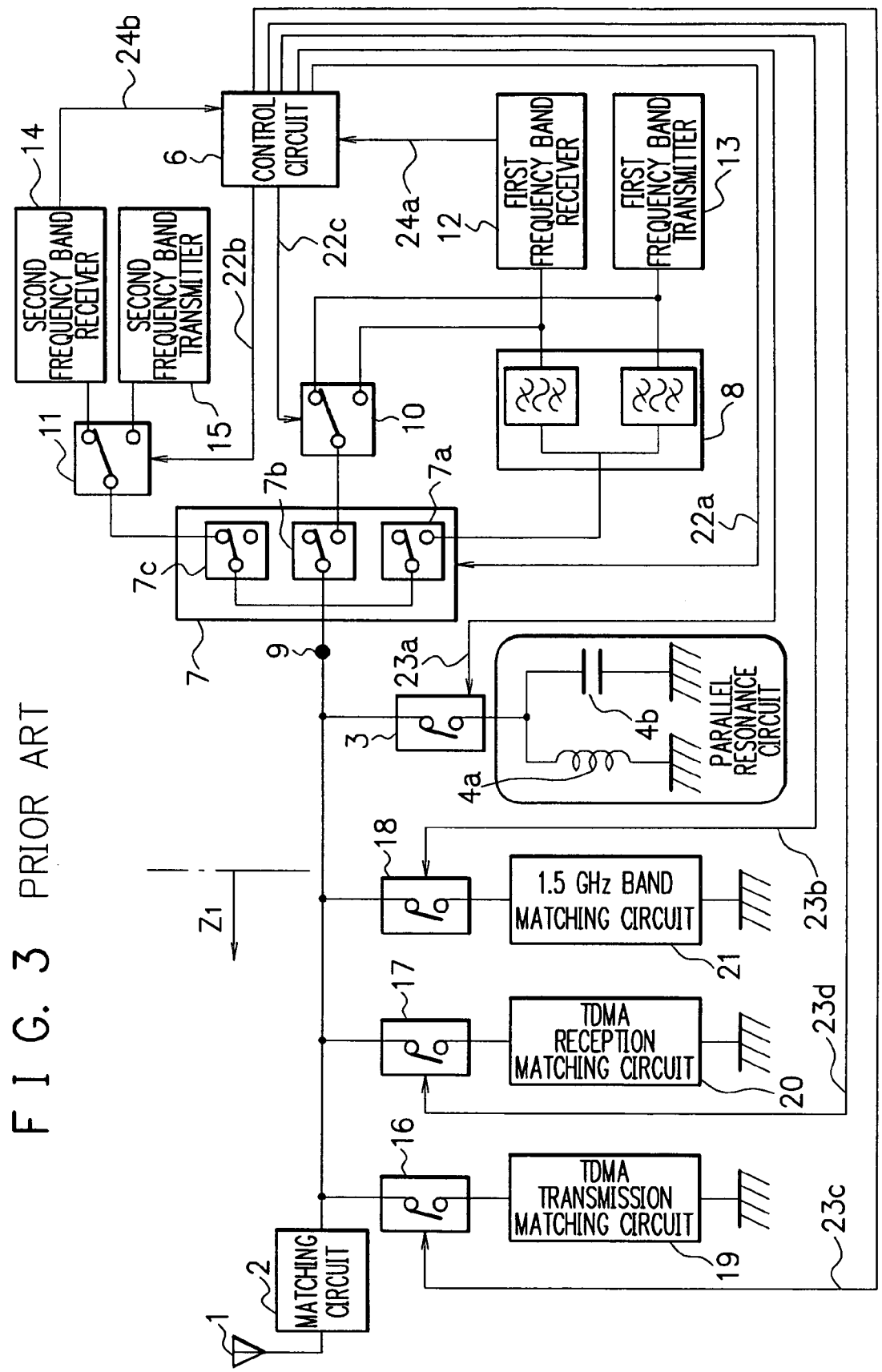
FIG. 3 is a diagram showing a configuration of a dual-band portable radio apparatus of the prior art.
Figure 4A:
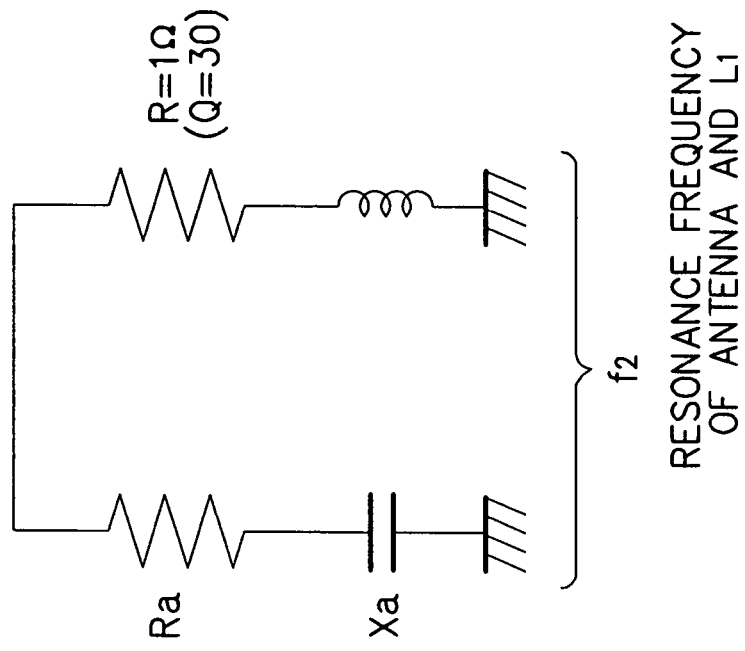
FIG. 4A is a diagram showing an equivalent circuit of a whip antenna for a resonance frequency.
Figure 4B:
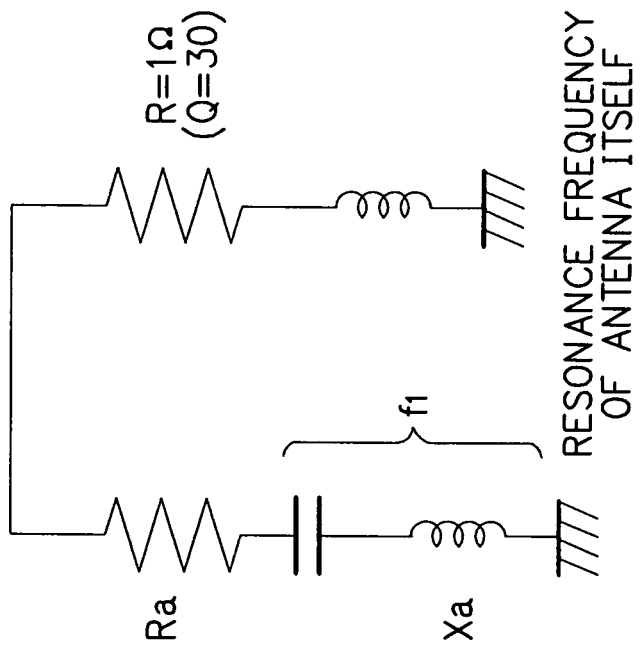
FIG. 4B is a diagram showing an equivalent circuit of the whip antenna in a frequency band lower than the resonance frequency thereof.

FIGS. 4A and 4B show equivalent circuits of a circuit part including the antenna and the inductance $L_1$. FIG. 4A shows an equivalent circuit for a resonance frequency of the antenna. FIG. 4B shows an equivalent circuit for a frequency band lower than the resonance frequency. Since the resonance frequency $f_1$ of the antenna is adjusted to a frequency in the proximity of an upper limit of the band, the equivalent circuit is an inductive series resonance circuit in a frequency band more than $f_1$. The equivalent circuit is a capacitive series resonance circuit in a frequency band less than $f_1$.

The parallel inductor $L_1$ disposed in parallel with the antenna is adjusted to cause resonance with a frequency in the neighborhood of a lower limit of the frequency band. Assuming that the resonance frequency is $f_2$, the whip antenna 1 has two resonance points $f_1$ and $f_2$ in the frequency band. The antenna has a two-resonance characteristic and hence can be used for wide-band operation.

Figure 5:
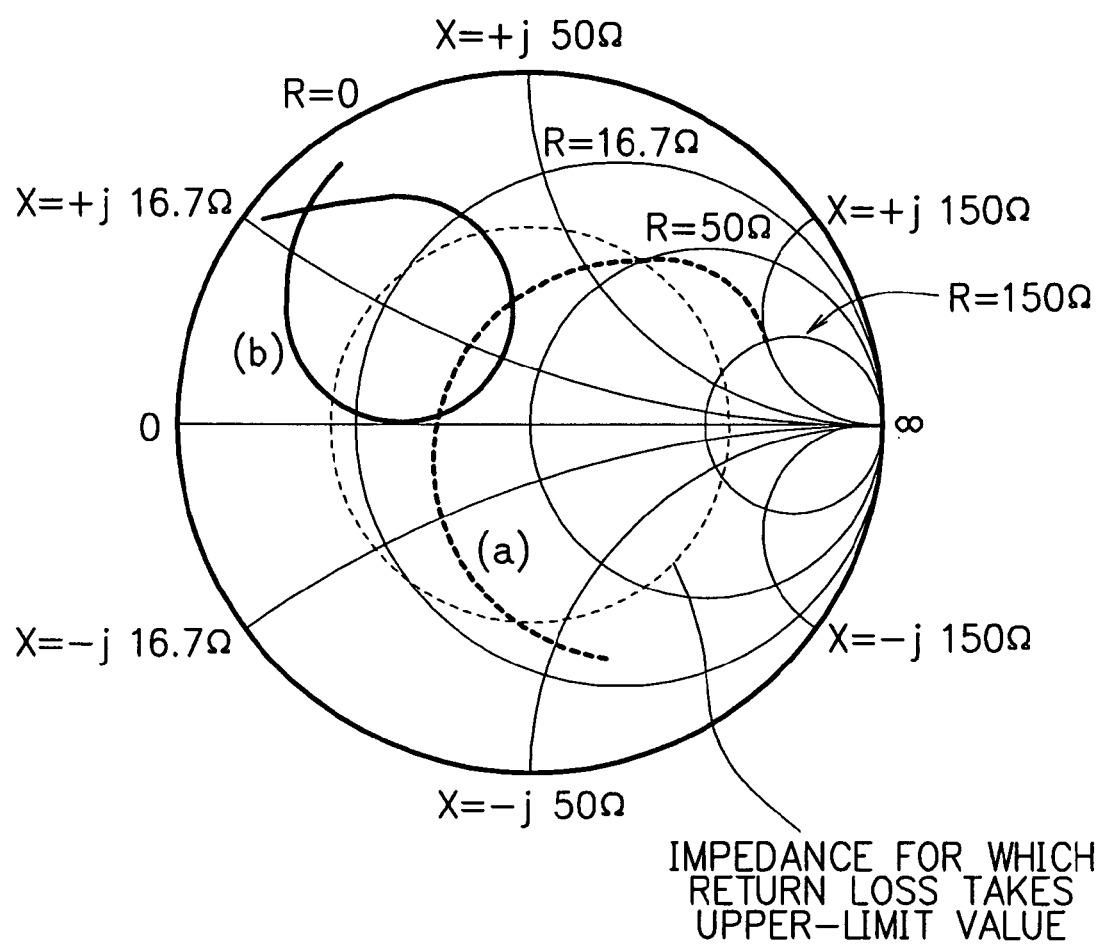
FIG. 5 is a Smith chart showing impedance when an inductor is disposed in parallel with an antenna.

Since the inductor $L_1$ is arranged in parallel with the antenna, the input impedance for the antenna is changed from (a) to (b) in the Smith chart of FIG. 5. The antenna has a resonance frequency $f_1$ of its own and a resonance frequency $f_2$ of a combination of the antenna and the inductor $L_1$. Therefore, the input impedance draws a closed loop on the Smith chart for frequency components in the vicinity of the frequency band.

In a desired frequency band, when the input impedance with the inductance $L_1$ arranged as above is outside a circle in which the return loss takes an upper-limit value, a capacitor C is coupled in series and an inductor $L_2$ is connected in parallel with the combination of the antenna and the inductance $L_1$. By adjusting values of these components, the input impedance of the antenna is set to a value corresponding to $R=Z_0$ and $Z=0$ so that the input impedance for the desired frequency is within a circle which is centered on $R=Z_0$ and $Z=0$ and for which the return loss takes an upper-limit value as shown in FIG. 6.

As can be seen from FIG. 7, by changing the combination of the capacity of the capacitor C and the inductance of the inductor $L_2$, it is possible to set the input impedance for the desired frequency to a point within a circle with a prescribed radius centered on $R=Z_0$ and $Z=0$.

By reducing the return loss to a value equal to or less than a predetermined value for all frequency components of the frequency band as above, an impedance match can be provided for the frequency components of the frequency band by use of a matching circuit including the inductors $L_1$ and $L_2$ and the capacitor C. That is, the matching with the antenna is achieved by a single matching circuit for all frequency components of the frequency band to thereby extend the bandwidth of the antenna.

Next, description will be given of embodiments of the present invention based on the principle described above.

First Embodiment

Figure 8:
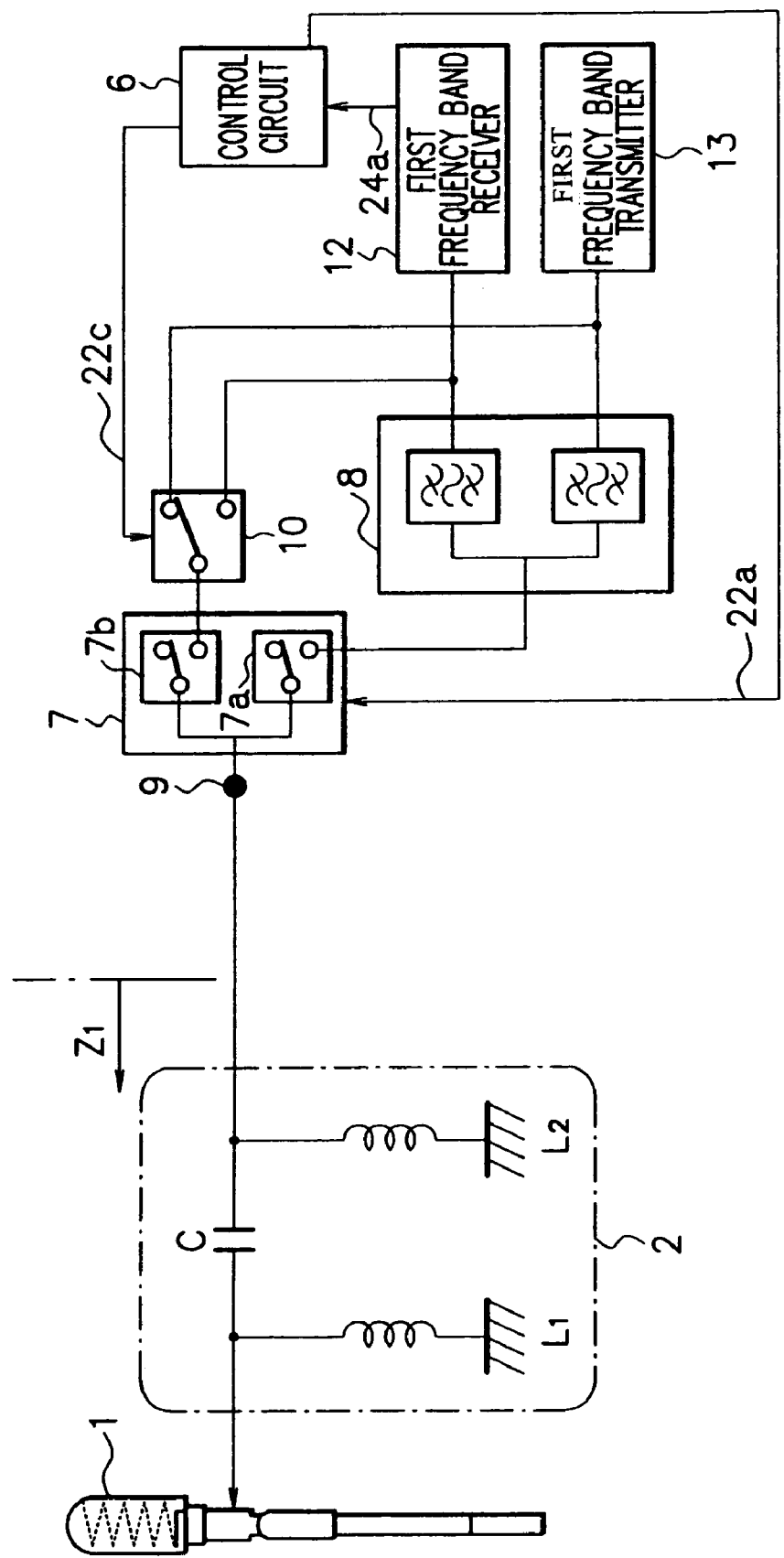
FIG. 8 is a diagram showing a configuration of a portable telephone according to a first embodiment of the present invention.

Description will now be given of a first embodiment in accordance with the present invention. FIG. 8 shows a configuration of a portable radio apparatus in the first embodiment. The apparatus includes a whip antenna 1, a matching circuit 2, a control circuit 6, a radio circuit changing switch 7, a unit for transmission and reception 8, a first frequency band transmission and reception changing switch 10, a first frequency band receiver circuit 12, and a first frequency band transmitter circuit 13.

The whip antenna 1 is an expandable and contractible antenna and includes a helical antenna in an end section thereof. The antenna 1 includes an expanding and contracting element adjusted to have a length of about $\lambda/4$. Since the helical antenna is also adjusted to a length of about $\lambda/4$, the element and the helical antenna are substantially equal in impedance to each other in the expanded and contracted or housed states. Therefore, the expansion and contraction of the whip antenna 1 will not be considered in this description.

The matching circuit 2 includes a set of parallel inductors $L_1$ and $L_2$ connected in parallel with the whip antenna 1 and a capacitor C coupled in series with the antenna 1. Thanks to the matching circuit 2, the whip antenna 1 has an antenna characteristic of two resonance frequencies. Therefore, without conducting a change-over operation between matching circuits, the system can cope with the TDMA communication and the communication using the duplex function.

The control circuit 6 receives a signal specifying transmission or reception and a signal indicating a communication method or system via the first frequency band receiver circuit 12 from a base station. According to these signals, the controller 6 controls a change-over operation of the radio circuit changing switch 7 and the transmission and reception changing switch 10.

The switch 7 is a switch to select a radio circuit to be connected to the whip antenna 1 and includes a first frequency band transmission and reception simultaneous selection switch 7a and a first frequency band transmission and reception changing switch 7b. In response to a control signal from the controller 6, the switch 7 is changed over depending on whether the transmission and the reception are simultaneously conducted or are conducted at different points of timing in a frequency band to be used.

The unit for transmission and reception 8 is a radio circuit adopted to conduct the transmission and the reception at the same time in the frequency band.

The first frequency band transmission and reception changing switch 10 is employed when the transmission and the reception are conducted at different points of timing in the frequency band. According to a control signal from the control circuit 6, the switch 10 connects the first frequency band receiver circuit 12 to the matching circuit 2 at reception timing and connects the first frequency band transmitter circuit 13 to the matching circuit 2 at transmission timing.

The circuit 12 is a circuit to decode information of a radio signal in a first frequency band received by the whip antenna 1. The circuit 13 encodes information to be sent as a radio signal of the first frequency band.

When conducting the transmission and the reception at the same time in the frequency band, the circuit 12 decodes the signal indicating a communication method from the base station to resultantly deliver a control signal 24a to the controller 6. In response thereto, the controller 6 feeds a control signal 22a to the radio circuit changing switch 7. According to the signal 22a, the switch 7 closes the switch 7a and opens the switch 7b to connect the matching circuit 2 via the switch 7a to the transmission and reception unit 8.

In the communication to accomplish the transmission and the reception at mutually different point of timing in the frequency band, the circuit 12 decodes the signal specifying a communication method from the base station and then feeds the received signal to the controller 6. According to the signal, the control section 6 delivers a control signal 22a to the switch 7. In response to the signal 22a, the switch 7 opens the switch 7a and closes the switch 7b to link the matching circuit 2 via the switch 7b to the switch 10.

The first frequency band receiver circuit 12 decodes the signal regarding transmission or reception from the base station and sends the received signal to the controller 6. According to the signal, the controller 6 delivers a control signal 22c to the switch 10 at reception timing to select operation on the side of the circuit 12. The controller 6 sends a control signal 22c to the switch 10 at transmission timing to select the circuit 13.

Description will now be given of a method of adjusting the matching circuit 2.

FIGS. 9A and 9B show impedance of a helical antenna in the 800 MHz band. First, the resonance frequency of the helical antenna is adjusted so as to be in the proximity of a higher frequency, i.e., an upper limit of the frequency band (800 MHz in this case). Next, the parallel inductor $L_1$ is arranged in parallel with the antenna 1. For the inductor $L_1$, it is required to select the constant to cause resonance at a lower frequency (point A) of the frequency band. In this situation, the constant is set to about 5 nH. FIG. 10 shows input impedance when the parallel inductor $L_1$ is disposed.

Figure 11B:
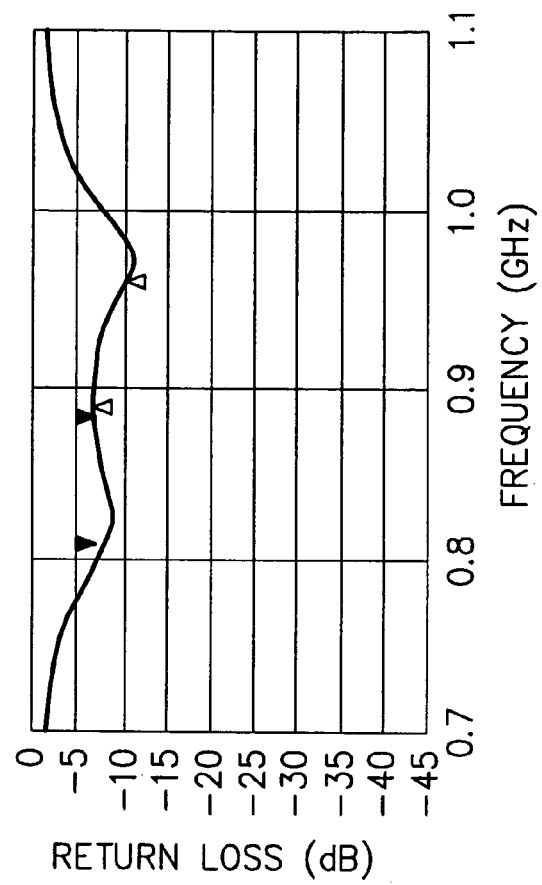
FIG. 11B is a graph showing a relationship between a return loss of an antenna and a frequency in the state of FIG. 11A.
Figure 11A:
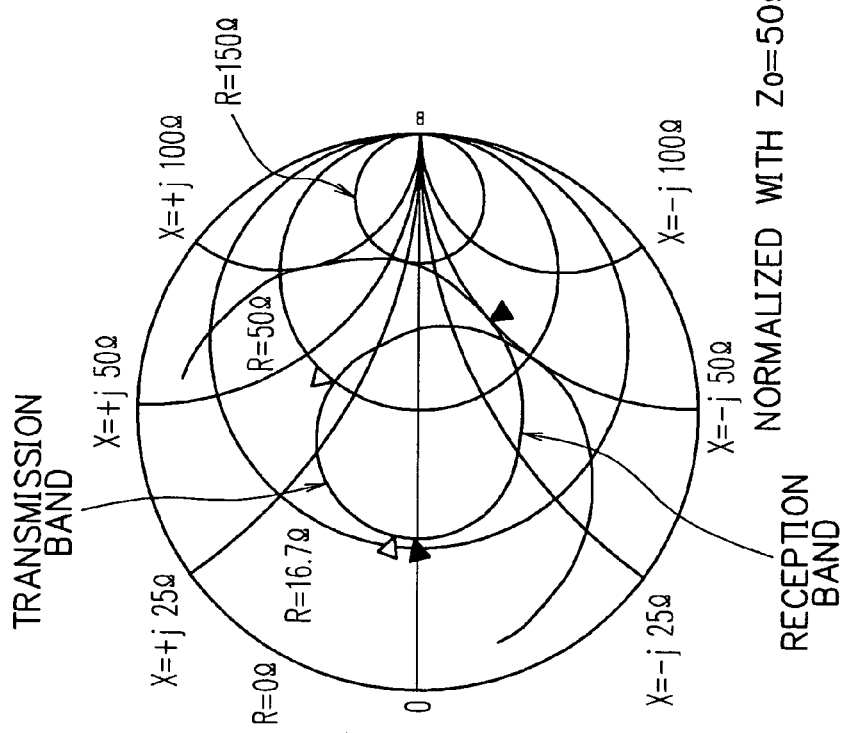
FIG. 11A is a Smith chart showing input impedance of an antenna with matched impedance.

The series capacitor C arranged in series between the whip antenna 1 and the switch 7 and the parallel inductor $L_2$ connected in parallel also therebetween are adjusted such that impedance $Z_1$ observed via the side of the antenna 1 from an observing point 9 is in a range to set the return loss is equal to or less than a predetermined value, −5 dB or less, more desirably, −10 dB or less, for all frequency components in the frequency band. FIGS. 11A and 11B show input impedance for the antenna 1 thus set in the matching state.

By adjusting the matching circuit 2 as above, the frequency components of the 800 MHz band can be covered only by the matching circuit 2 and hence the change-over operation to select an appropriate matching circuit is not required.

Description will be given of the radiation efficiency. FIGS. 12A and 12B show a relationship between the parallel inductance $L_1$ and the Q factor value. The ordinate indicates the radiation efficiency (dB) and the abscissa designates value of Q. FIG. 12A represents the relationship in a free space and FIG. 12B shows the relationship in a call position (on the side of the human head). The graphs of FIGS. 12A and 12B show the difference between the radiation efficiency of the whip antenna 1 in the embodiment and the radiation efficiency in a circuit configuration in which a change-over operation is conducted to select a matching circuit according to a call method.

As can be seen from FIG. 12A, the radiation efficiency of the antenna 1 is almost kept unchanged in the free space even when the Q factor of the inductance $L_1$ is changed. On the other hand, as shown in FIG. 12B, the radiation efficiency is improved in the call position as the value of the Q factor increases.

The difference in the radiation efficiency is made as follows. In the equivalent circuits of the antenna 1 and the inductance $L_1$ as shown in FIGS. 4A and 4B, since radiation resistance Ra is sufficiently larger than a resistance component R of the inductance $L_1$ in the free space, a loss by the resistance component R of the inductance $L_1$ is negligible. However, the radiation resistance of the antenna becomes smaller in the call position and hence the loss by the resistance component R of the inductance $L_1$ cannot be ignored.

More specifically, the radiation efficiency η of the antenna 1 is expressed as follows:

$$\eta = Prad/\text{Pin} \qquad (2)$$
$$= (\text{Pin} - Pantloss - Pmloss - Pref)/\text{Pin}$$

wherein Pin designates energy fed via a matching circuit to the antenna, Prad indicates energy radiated from the antenna, Pantloss is loss by the antenna, Pmloss designates loss by the matching circuit, and Pref is a return loss.

As can be seen from expression (2), when the value of the Q factor of the inductance $L_1$ increases, the matching circuit loss Pmloss decreases and the radiation efficiency η increases.

Consequently, by increasing Q of the inductance $L_1$ and decreasing R, deterioration in the radiation characteristic can be minimized also in the call position. By setting the value of the Q factor to 40 or more, there is obtained, as shown in FIG. 12B, a radiation efficiency better than that attained by a circuit configuration in which an appropriate matching circuit is selected through a change-over operation.

The value of Q of the inductance is expressed as $Q=\omega L/R$, where R indicates a resistance component, ω is an angular frequency, and L designates an inductance component. Based on the inductance of $L_1$ measured by a network analyzer, the value of the Q factor is calculated by this expression.

Figure 13:
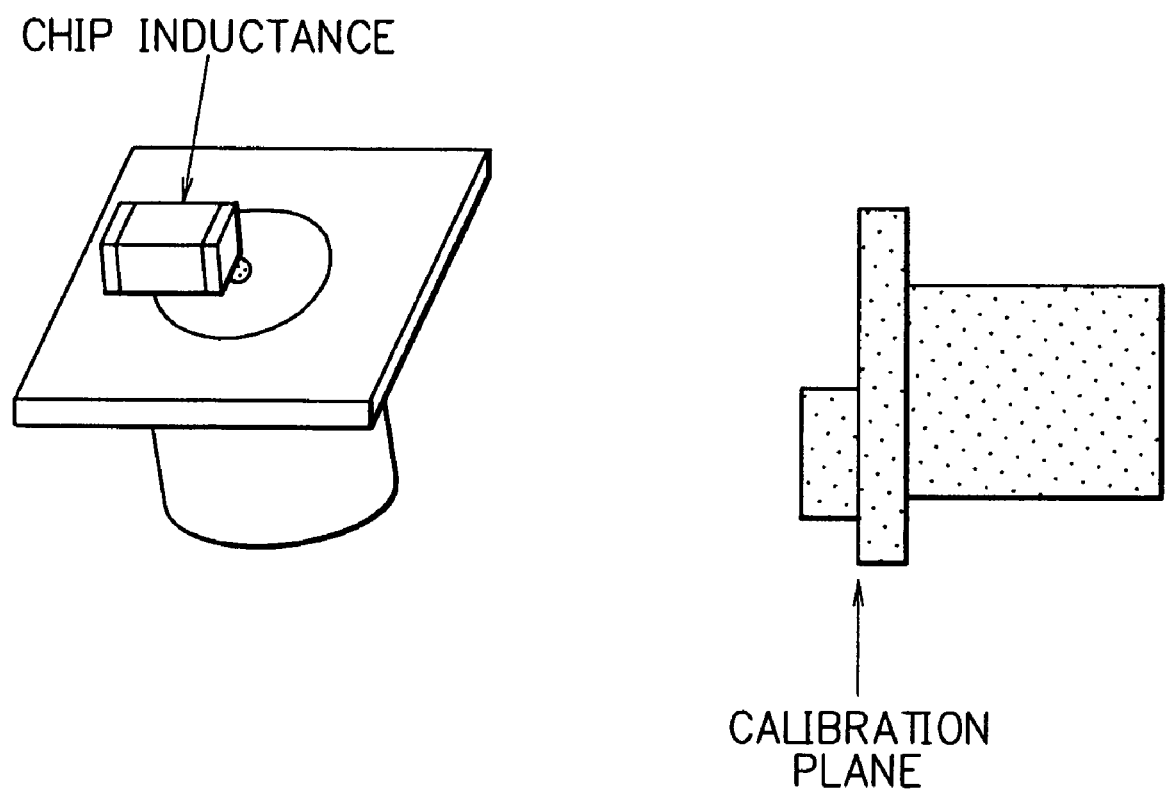
FIG. 13 is a diagram to explain a method of measuring the Q factor value of inductance.

Although the measurement of the inductance of $L_1$ may be conducted with a jig dedicated to the measurement, it is also possible to measure the inductance with an end surface of an SMA connector as a calibration plane. In this case, the inductor $L_1$ is placed on the end surface of the SMA connector as shown in FIG. 13. One terminal of the inductor is connected to ground in a peripheral zone of the SMA connector and the other terminal thereof is linked with a central conductor of a coaxial cable exposed in a central area of the end surface of the SMA connector. When the inductance of the parallel inductor $L_1$ is measured in this state, any measurement error due to a contour of the jig can be suppressed. The value of the Q factor is therefore measured with higher precision.

Description has been given of a case in which the impedance of the helical antenna is capacitive in the 800 MHz band. Even when the impedance is inductive, the two-resonance characteristic can be obtained for the antenna and the matching circuit as above by arranging a capacitor in parallel with the antenna. The loss by the matching circuit 2 is mainly influenced by Q of the inductance $L_1$, and hence can be reduced by setting the circuit system such that the Q factor value of $L_1$ is larger than that of $L_2$. By increasing the Q factor value of $L_2$ as well as that of $L_1$, the loss by the matching circuit 2 can be much more lowered.

As can be clear from the description, in accordance with the present invention, even when a narrow-band antenna is employed, a wide-band operation can be conducted by the antenna without conducting a change-over operation to select an appropriate matching circuit. By setting the Q factor of the inductance on the antenna side to 40 or more, a wide-band and appropriate characteristics can be obtained. Consequently, the matching circuit and the logic circuit to control switches can be reduced in size, and hence power consumption is reduced.

Second Embodiment

The present invention is applicable also to the dual-band portable radio apparatus having the problem mentioned previously.

Description will now be given of a second embodiment of the present invention, in which the present invention is applied to a dual-band apparatus operating in a plurality of frequency bands.

Figure 14:
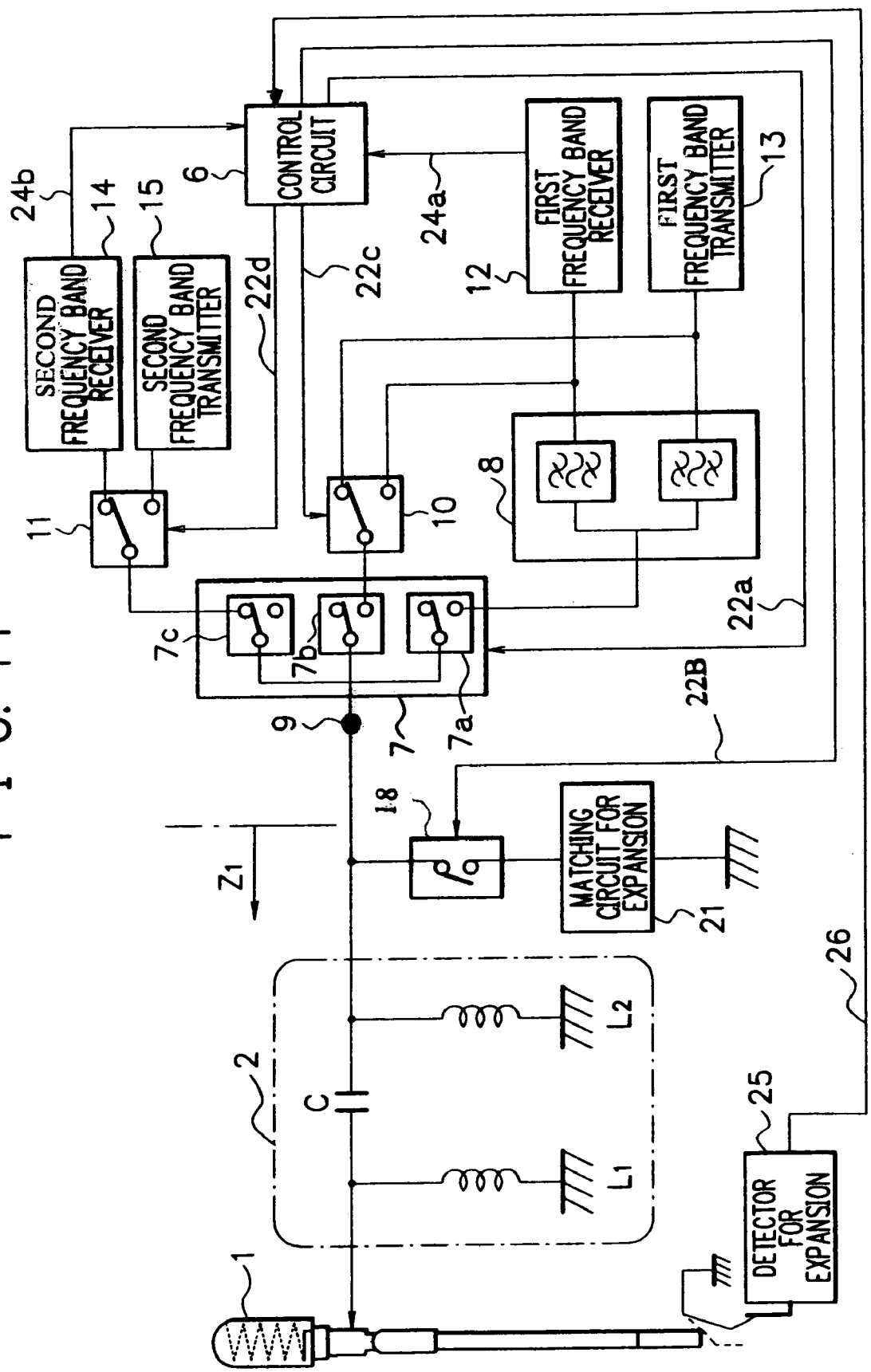
FIG. 14 is a circuit diagram showing a configuration of a portable telephone according to a second embodiment of the present invention.

FIG. 14 shows a configuration of a radio communication apparatus in the second embodiment. The apparatus includes, in addition to the components of the first embodiment, an expansion detecting switch 25, a matching circuit changing switch 18, an expansion matching circuit 21, a second frequency band receiver circuit 14, a second frequency band transmitter circuit 15, and a second frequency band transmission and reception change-over switch 11.

The expansion detecting switch 25 is a switch to detect an event in which the whip antenna 1 is in an expanded state. In the state in which the antenna 1 is expanded, the switch 25 feeds an expansion detection signal 26 to the controller 6.

The matching circuit changing switch 18 conducts, in response to a control signal 22b from the control section 6, a change-over operation to determine whether or not the expansion matching circuit 21 is connected to the matching circuit 2.

Only when the antenna 1 is in an expanded state and the operation is to be conducted in the 1.5 GHz band, the circuit 21 is coupled via the matching circuit changing switch 18 to the matching circuit 2.

The second frequency band receiver circuit 14 is a circuit to decode information of a radio signal in the second frequency band received by the antenna 1. The second frequency band transmitter circuit 15 encodes information to be transmitted as a radio signal in the second frequency band.

To communicate radio signals in the second frequency band respectively at different points of timing, the second frequency band transmission and reception change-over switch 11 links, in response to a control signal 22d from the controller 6, the circuit 14 to the matching circuit 2 at reception timing and the circuit 15 to the matching circuit 2 at transmission timing.

The control section 6 receives a signal indicating a frequency band from a base station, a signal specifying transmission or reception, and a signal regarding a communication method via the circuit 12 or the circuit 14. The signals are received as control signals 24a and 24b. According to the control signals, the controller 6 outputs control signals 22a, 22c, and 22d. Each control signal is used to control a change-over operation for the switch 7, 10, or 11.

The switch 7 is a switch to select a radio circuit to be coupled with the antenna 1. In addition to the components of the first embodiment, the second frequency band selection switch 7c is additionally disposed in this embodiment. In response to the control signal 22a from the controller 6, the switch 7 conducts a change-over operation according to whether the communication is conducted in the first or second frequency band. When the first frequency band is used, the switch 7 carries out a change-over operation according to whether transmission and reception are simultaneously conducted or is conducted at different points of timing.

The other configuration of the radio communication apparatus in the second embodiment is substantially equal to that of the radio communication apparatus in the first embodiment. Therefore, the same constituent elements are assigned with the same reference numerals in both embodiments and hence description thereof will be avoided. However, "a band to be used" in the first embodiment will be referred to as "a first frequency band" in the second embodiment.

The whip antenna 1 is adjusted such that the expanding and contracting element has a length of about λ/4 for $f_l$ in the lower one of the first and second frequency bands. Therefore, the element of the antenna 1 has an electrical length equal to or more than λ/2 for $f_h$ in the higher one of the first and second frequency bands.

The helical antenna has resonance frequencies respectively for $f_l$ and $f_h$ and is a two-frequency element operating as a λ/4 antenna.

In operation in the lower frequency band $f_l$, the electrical length and the impedance of the antenna 1 are kept unchanged in the expanded and contracted states. Consequently, for the frequency $f_l$, a matched state can be set by one matching circuit regardless of whether the antenna 1 is expanded or contracted.

However, in operation in the higher frequency band $f_h$, since the electrical length of the antenna 1 is λ/2 in the expanded state and λ/4 in the contacted state, it is impossible to establish the matched state with the same matching circuit.

Consequently, the configuration of the embodiment includes the expansion detecting switch 25 to sense a state of the expansion or contraction of the antenna 1. Only when the antenna 1 is in the expanded state and operates in the 1.5 GHz band, the expansion matching circuit 21 is coupled with the matching circuit 2.

Description will now be given of operation of the portable radio apparatus in the embodiment.

Assume that the lower frequency band $f_l$ is selected for operation. When the antenna 1 is expanded, the switch 25 detects the expanded state of the antenna 1. However, since the switch 18 is off, i.e., opened in the expanded and contracted state, a combination of the parallel inductance $L_1$, the series capacitor C, and the parallel inductance $L_2$ operates as a matching circuit regardless of whether the antenna 1 is expanded or contracted.

Assume now that the higher frequency band $f_h$ is selected. When the antenna 1 is contracted or housed, the switch 25 does not produce any detection signal and hence the switch 18 is off. Therefore, as in the case where the lower frequency band $f_l$ is selected, only the combination of the inductance $L_1$, the series capacitor C, and the inductance $L_2$ operates as a matching circuit.

On the other hand, when the antenna 1 is expanded, the switch 25 delivers a detection signal to the controller 6. In response to the signal, the controller 6 turns the switch 18 on (i.e., the switch 18 is closed). This combines the matching change-over circuit 21 with the matching circuit 2 to provide an impedance match between the combined circuits and the antenna 1.

Figure 15B:
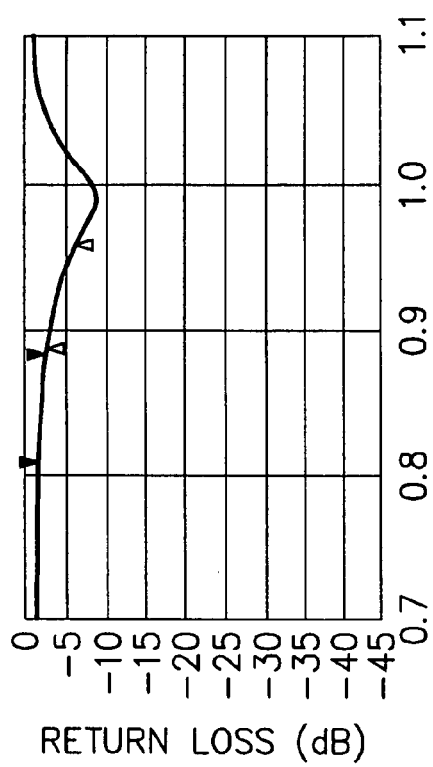
FIG. 15B is a graph showing a relationship between a return loss of the contracted antenna and a frequency in a lower frequency band.
Figure 15C:
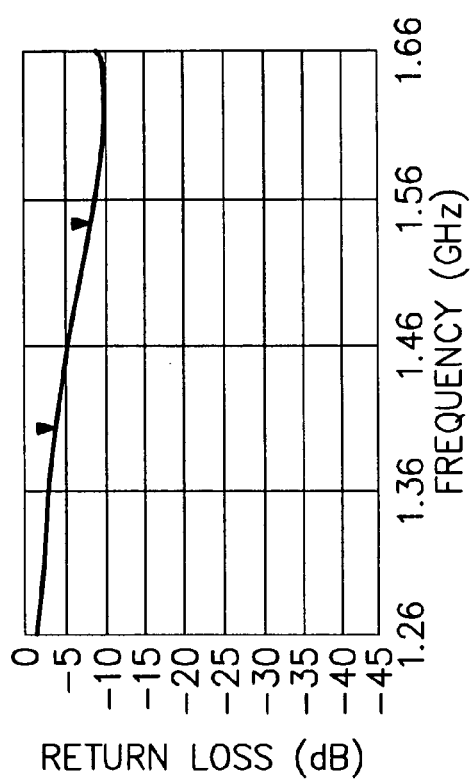
FIG. 15C is a graph showing a relationship between a return loss of the contracted antenna and a frequency in a higher frequency band.
Figure 15A:
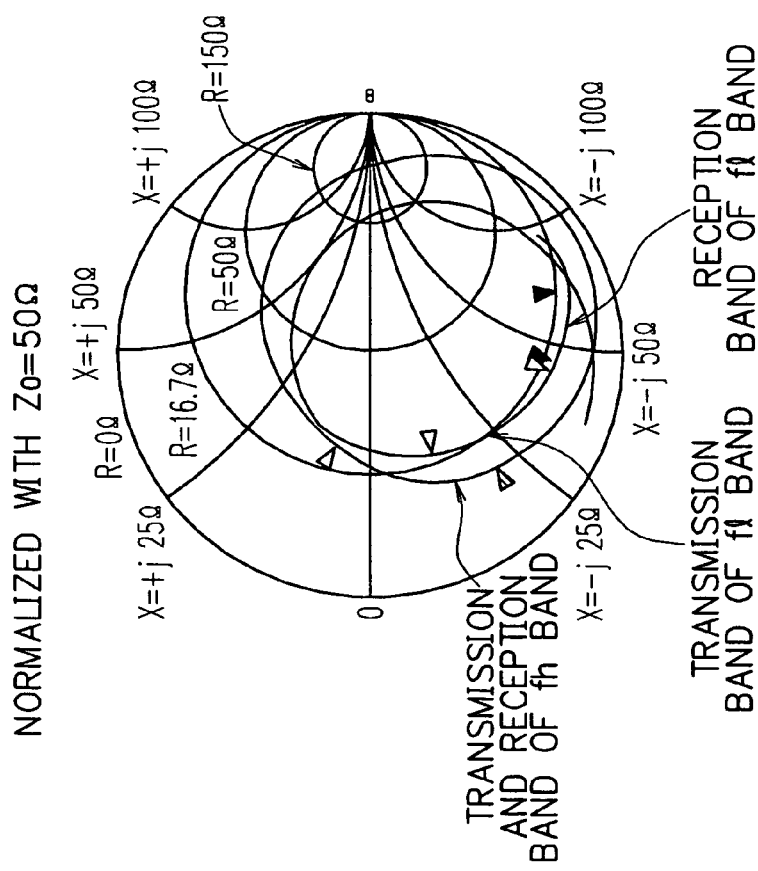
FIG. 15A is a Smith chart showing input impedance of a two-resonance antenna in a contracted state.

FIG. 15A shows impedance of the helical antenna element of the whip antenna 1. FIGS. 15B and 15C show the return loss of the helical antenna element. The ordinate indicates the return loss (dB) and the abscissa designates the frequency (GHz). The graphs of FIGS. 15B and 15C correspond to the lower and higher frequency bands, respectively.

As can be seen from FIG. 15A, the helical antenna element itself has a resonance frequency for each of the lower and higher frequency bands.

FIG. 16A shows input impedance $Z_1$ observed from an observation point 9 to the side of the antenna 1 when the switch 7b is off. FIGS. 16B and 16C show the return loss in this state. The ordinate indicates the return loss (dB) and the abscissa designates the frequency (GHz). FIGS. 16B and 16C respectively correspond to the lower and higher frequency bands.

As shown in FIG. 16B, in the lower frequency band, the return loss changes less in the overall band. Also in the higher frequency band, a satisfactory impedance matching is obtained.

Figure 17B:
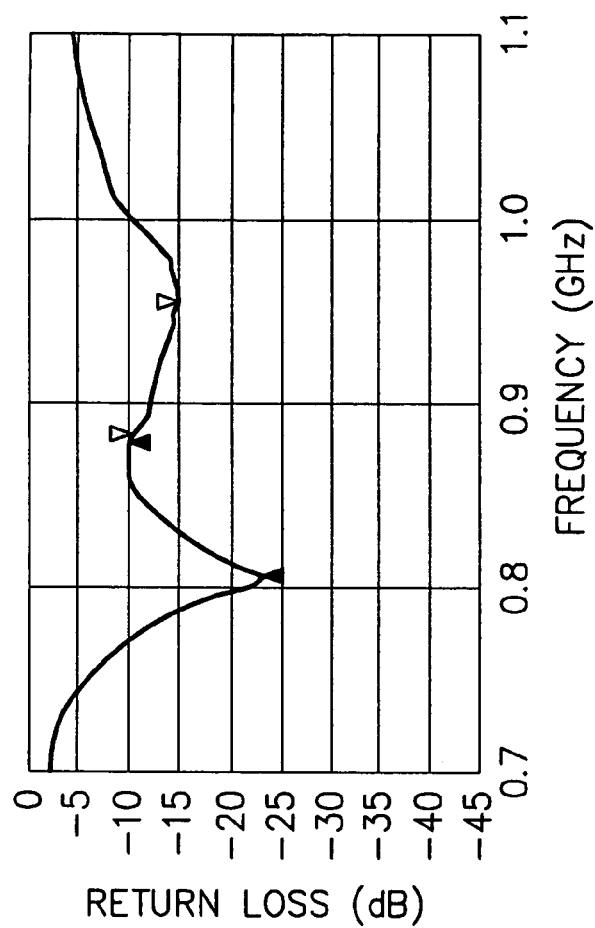
FIG. 17B is a graph showing a relationship between a return loss of the expanded antenna with matched impedance and a frequency in a lower frequency band.
Figure 17A:
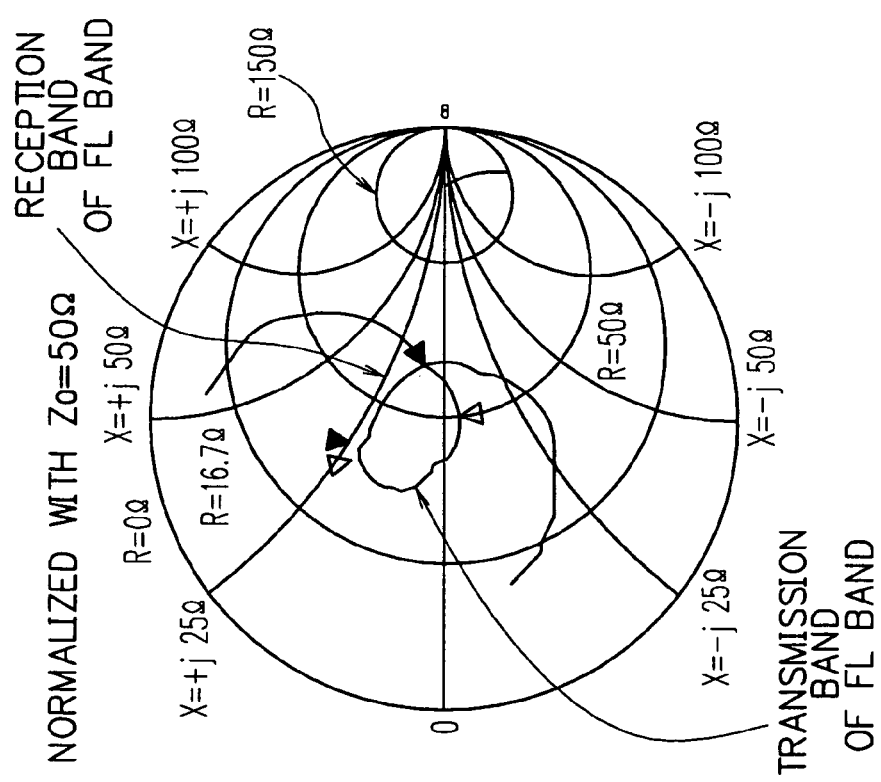
FIG. 17A is a Smith chart showing input impedance of an expanded two-resonance antenna with matched impedance in a lower frequency band.

FIG. 17A shows impedance of the expanded whip antenna 1 in the lower frequency band. FIG. 17B shows the return loss of the antenna 1 in the expanded state for operation in the band. The ordinate indicates the return loss (dB) and the abscissa designates the frequency (GHz). Since the operation is carried out in the lower frequency band, the expansion matching circuit 21 is not connected to the matching circuit 2.

FIG. 18A shows impedance of the expanded whip antenna 1 in the higher frequency band. FIG. 18B shows the return loss of the expanded antenna in operation in the frequency band. The ordinate represents the return loss (dB) and the abscissa indicates the frequency (GHz). Data shown in FIGS. 18A and 18B is obtained with the configuration in which the expansion matching circuit 21 is coupled with the matching circuit 2.

As can be seen from FIGS. 18A and 18B, when the whip antenna 1 is expanded, sufficiently good impedance matching is obtained for the lower and higher frequency bands.

According to the portable radio apparatus of the embodiment, in a lower frequency band, a wide-band operation can be accomplished using a matching circuit constructed in simple structure. In a higher frequency band, an impedance match can be provided with one and the same matching circuit regardless of whether the antenna is expanded or contracted. In consequence, a multiband portable radio apparatus can be implemented using a matching circuit of a simple configuration.

The portable radio apparatus of the embodiment includes a matching circuit to be shared under all conditions. When the antenna is expanded in operation for a predetermined frequency band, the matching circuit is combined with another circuit. Consequently, there can be implemented a matching circuit in simple structure to cope with a dual-band operation using a plurality of frequency bands as well as coping with addition of a duplex function.

The embodiments of the present invention have been described by way of illustration only, and the present invention is not restricted by the embodiments.

For example, a portable telephone is cited as an example of the portable radio apparatus in the description of the embodiments. However, the present invention is not restricted by the embodiments, but can be applied to, for example, a transceiver, a PHS (Personal Handyphone System) terminal and the like.

Although the multiband operation in the 800 MHz band and the 1.5 GHz band has been described, the present invention is not restricted by the embodiments, but can also be applied to, for example, a portable radio apparatus serving as a portable telephone and a PHS telephone, and a portable radio apparatus functioning as a PDC terminal and a W-band telephone.

As set forth hereinabove, the embodiments can be modified and changed in various ways.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A portable radio apparatus, comprising:
   an antenna for transmitting and receiving a radio signal;
   a radio circuit for decoding the radio signal received via the antenna and encoding a signal to be transmitted as a radio signal via the antenna; and
   a matching circuit for providing an impedance match between the antenna and the radio circuit; wherein:
   the matching circuit includes at least one inductive element connected in parallel to the antenna; and
   said at least one of the inductive element has a Q factor more than a predetermined value, the Q factor being expressed as follows:

$Q=\omega L/R$ wherein R indicates a resistance component, L is an inductance component, and $\omega$ designates an angular frequency of the radio signal.

2. A portable radio apparatus in accordance with claim 1, wherein:
   the matching circuit is a π type circuit in which a first inductive element is connected in parallel on the side of the antenna and a second inductive element is connected in parallel on the side of the radio circuit; and
   the first inductive element has a Q factor more than a Q factor of the second inductive element.

3. A portable radio apparatus in accordance with claim 2, wherein:
   the radio circuit is a circuit for decoding and encoding the radio signal in a plurality of frequency bands; and
   the antenna has different two resonance frequencies in one of the frequency bands.

4. A portable radio apparatus in accordance with claim 2, wherein:
   the radio circuit is a circuit for decoding and encoding the radio signal in a plurality of frequency bands;
   the antenna has different two resonance frequencies in one of the frequency bands; and
   the antenna includes a straight section and a helical section, the helical section having a two-resonance characteristic.

5. A portable radio apparatus in accordance with claim 2, further comprising:
   a detector for detecting whether the antenna is in an expanded state in which the antenna is expanded; and
   an expansion matching circuit impedance of which matches with the antenna in the expanded state in a particular frequency band when the expansion matching circuit is connected to the matching circuit;
wherein:
the radio circuit is a circuit for decoding and encoding the radio signal in a plurality of frequency bands;
the antenna has different two resonance frequencies in one of the frequency bands;
the antenna includes a straight section and a helical section, the helical section having a two-resonance characteristic; and
the expansion matching circuit is connected to the matching circuit when the antenna is in the expanded state and a particular one of the frequency bands is selected.

6. A portable radio apparatus in accordance with claim 2, further comprising:
a detector for detecting whether the antenna is in an expanded state in which the antenna is expanded; and
an expansion matching circuit impedance of which matches with the antenna in the expanded state in a particular frequency band when the expansion matching circuit is connected to the matching circuit;
wherein:
the radio circuit is a circuit for decoding and encoding the radio signal in a plurality of frequency bands;
the antenna has different two resonance frequencies in one of the frequency bands;
the antenna includes a straight section and a helical section, the helical section having a two-resonance characteristic;
the expansion matching circuit is connected to the matching circuit when the antenna is in the expanded state and a particular one of the frequency bands is selected; and
impedance of the antenna in the expanded state matches that of the matching circuit in a frequency band for which the expansion matching circuit is not connected to the matching circuit.

7. A portable radio apparatus in accordance with claim 1, wherein:
the matching circuit is a π type circuit in which a first inductive element is connected in parallel on the side of the antenna and a second inductive element is connected in parallel on the side of the radio circuit;
the first inductive element has a Q factor more than a Q factor of the second inductive element; and
the Q factor of the first inductive element takes a value, which sets radiation efficiency of the antenna to a value equal to or more than a predetermined value when the radio signal is transmitted.

8. A portable radio apparatus in accordance with claim 7, wherein:
the radio circuit is a circuit for decoding and encoding the radio signal in a plurality of frequency bands; and
the antenna has different two resonance frequencies in one of the frequency bands.

9. A portable radio apparatus in accordance with claim 7, wherein:
the radio circuit is a circuit for decoding and encoding the radio signal in a plurality of frequency bands;
the antenna has different two resonance frequencies in one of the frequency bands; and
the antenna includes a straight section and a helical section, the helical section having a two-resonance characteristic.

10. A portable radio apparatus in accordance with claim 7, further comprising:
a detector for detecting whether the antenna is in an expanded state in which the antenna is expanded; and
an expansion matching circuit impedance of which matches with the antenna in the expanded state in a particular frequency band when the expansion matching circuit is connected to the matching circuit;
wherein:
the radio circuit is a circuit for decoding and encoding the radio signal in a plurality of frequency bands;
the antenna has different two resonance frequencies in one of the frequency bands;
the antenna includes a straight section and a helical section, the helical section having a two-resonance characteristic; and
the expansion matching circuit is connected to the matching circuit when the antenna is in the expanded state and a particular one of the frequency bands is selected.

11. A portable radio apparatus in accordance with claim 7, further comprising:
a detector for detecting whether the antenna is in an expanded state in which the antenna is expanded; and
an expansion matching circuit impedance of which matches with the antenna in the expanded state in a particular frequency band when the expansion matching circuit is connected to the matching circuit;
wherein:
the radio circuit is a circuit for decoding and encoding the radio signal in a plurality of frequency bands;
the antenna has different two resonance frequencies in one of the frequency bands;
the antenna includes a straight section and a helical section, the helical section having a two-resonance characteristic;
the expansion matching circuit is connected to the matching circuit when the antenna is in the expanded state and a particular one of the frequency bands is selected; and
impedance of the antenna in the expanded state matches that of the matching circuit in a frequency band for which the expansion matching circuit is not connected to the matching circuit.

12. A portable radio apparatus in accordance with claim 1, wherein:
the matching circuit is a π type circuit in which a first inductive element is connected in parallel on the side of the antenna and a second inductive element is connected in parallel on the side of the radio circuit;
the first inductive element has a Q factor more than a Q factor of the second inductive element; and
the Q factor of each of the first and second inductive elements takes a value, which sets radiation efficiency of the antenna to a value equal to or more than a predetermined value when the radio signal is transmitted.

13. A portable radio apparatus in accordance with claim 12, wherein:
the radio circuit is a circuit for decoding and encoding the radio signal in a plurality of frequency bands; and
the antenna has different two resonance frequencies in one of the frequency bands.

14. A portable radio apparatus in accordance with claim 12, wherein:
the radio circuit is a circuit for decoding and encoding the radio signal in a plurality of frequency bands;
the antenna has different two resonance frequencies in one of the frequency bands; and the antenna includes a straight section and a helical section, the helical section having a two-resonance characteristic.

15. A portable radio apparatus in accordance with claim 12, further comprising:
   a detector for detecting whether the antenna is in an expanded state in which the antenna is expanded; and
   an expansion matching circuit impedance of which matches with the antenna in the expanded state in a particular frequency band when the expansion matching circuit is connected to the matching circuit; wherein:
   the radio circuit is a circuit for decoding and encoding the radio signal in a plurality of frequency bands;
   the antenna has different two resonance frequencies in one of the frequency bands;
   the antenna includes a straight section and a helical section, the helical section having a two-resonance characteristic; and
   the expansion matching circuit is connected to the matching circuit when the antenna is in the expanded state and a particular one of the frequency bands is selected.

16. A portable radio apparatus in accordance with claim 12, further comprising:
   a detector for detecting whether the antenna is in an expanded state in which the antenna is expanded; and
   an expansion matching circuit impedance of which matches with the antenna in the expanded state in a particular frequency band when the expansion matching circuit is connected to the matching circuit; wherein:
   the radio circuit is a circuit for decoding and encoding the radio signal in a plurality of frequency bands;
   the antenna has different two resonance frequencies in one of the frequency bands;
   the antenna includes a straight section and a helical section, the helical section having a two-resonance characteristic;
   the expansion matching circuit is connected to the matching circuit when the antenna is in the expanded state and a particular one of the frequency bands is selected; and
   impedance of the antenna in the expanded state matches that of the matching circuit in a frequency band for which the expansion matching circuit is not connected to the matching circuit.

17. A portable radio apparatus in accordance with claim 1, wherein the Q factor of each of the inductive elements is more than 40.

18. A portable radio apparatus in accordance with claim 17, wherein:
   the radio circuit is a circuit for decoding and encoding the radio signal in a plurality of frequency bands; and
   the antenna has different two resonance frequencies in one of the frequency bands.

19. A portable radio apparatus in accordance with claim 17, wherein:
   the radio circuit is a circuit for decoding and encoding the radio signal in a plurality of frequency bands;
   the antenna has different two resonance frequencies in one of the frequency bands; and
   the antenna includes a straight section and a helical section, the helical section having a two-resonance characteristic.

20. A portable radio apparatus in accordance with claim 17, further comprising:
   a detector for detecting whether the antenna is in an expanded state in which the antenna is expanded; and
   an expansion matching circuit impedance of which matches with the antenna in the expanded state in a particular frequency band when the expansion matching circuit is connected to the matching circuit; wherein:
   the radio circuit is a circuit for decoding and encoding the radio signal in a plurality of frequency bands;
   the antenna has different two resonance frequencies in one of the frequency bands;
   the antenna includes a straight section and a helical section, the helical section having a two-resonance characteristic; and
   the expansion matching circuit is connected to the matching circuit when the antenna is in the expanded state and a particular one of the frequency bands is selected.

21. A portable radio apparatus in accordance with claim 17, further comprising:
   a detector for detecting whether the antenna is in an expanded state in which the antenna is expanded; and
   an expansion matching circuit impedance of which matches with the antenna in the expanded state in a particular frequency band when the expansion matching circuit is connected to the matching circuit; wherein:
   the radio circuit is a circuit for decoding and encoding the radio signal in a plurality of frequency bands;
   the antenna has different two resonance frequencies in one of the frequency bands;
   the antenna includes a straight section and a helical section, the helical section having a two-resonance characteristic;
   the expansion matching circuit is connected to the matching circuit when the antenna is in the expanded state and a particular one of the frequency bands is selected; and
   impedance of the antenna in the expanded state matches that of the matching circuit in a frequency band for which the expansion matching circuit is not connected to the matching circuit.

22. A portable radio apparatus in accordance with claim 1, wherein:
   the matching circuit is a $\pi$ type circuit in which a first inductive element is connected in parallel on the side of the antenna and a second inductive element is connected in parallel on the side of the radio circuit;
   the first inductive element has a Q factor more than a Q factor of the second inductive element; and
   the Q factor of each of the inductive elements is more than 40.

23. A portable radio apparatus in accordance with claim 22, wherein:
   the radio circuit is a circuit for decoding and encoding the radio signal in a plurality of frequency bands; and
   the antenna has different two resonance frequencies in one of the frequency bands.

24. A portable radio apparatus in accordance with claim 22, wherein:
   the radio circuit is a circuit for decoding and encoding the radio signal in a plurality of frequency bands;
   the antenna has different two resonance frequencies in one of the frequency bands; and
   the antenna includes a straight section and a helical section, the helical section having a two-resonance characteristic.

25. A portable radio apparatus in accordance with claim 22, further comprising:
a detector for detecting whether the antenna is in an expanded state in which the antenna is expanded; and
an expansion matching circuit impedance of which matches with the antenna in the expanded state in a particular frequency band when the expansion matching circuit is connected to the matching circuit; wherein:
the radio circuit is a circuit for decoding and encoding the radio signal in a plurality of frequency bands;
the antenna has different two resonance frequencies in one of the frequency bands;
the antenna includes a straight section and a helical section, the helical section having a two-resonance characteristic; and
the expansion matching circuit is connected to the matching circuit when the antenna is in the expanded state and a particular one of the frequency bands is selected.

26. A portable radio apparatus in accordance with claim 22, further comprising:
a detector for detecting whether the antenna is in an expanded state in which the antenna is expanded; and
an expansion matching circuit impedance of which matches with the antenna in the expanded state in a particular frequency band when the expansion matching circuit is connected to the matching circuit; wherein:
the radio circuit is a circuit for decoding and encoding the radio signal in a plurality of frequency bands;
the antenna has different two resonance frequencies in one of the frequency bands;
the antenna includes a straight section and a helical section, the helical section having a two-resonance characteristic;
the expansion matching circuit is connected to the matching circuit when the antenna is in the expanded state and a particular one of the frequency bands is selected; and
impedance of the antenna in the expanded state matches that of the matching circuit in a frequency band for which the expansion matching circuit is not connected to the matching circuit.

27. A portable radio apparatus in accordance with claim 22, wherein the matching circuit is a π type circuit in which a first capacitive element is connected in parallel on the side of the antenna and a second capacitive element is connected in parallel on the side of the radio circuit.

28. A portable radio apparatus in accordance with claim 27, wherein:
the radio circuit is a circuit for decoding and encoding the radio signal in a plurality of frequency bands; and
the antenna has different two resonance frequencies in one of the frequency bands.

29. A portable radio apparatus in accordance with claim 27, wherein:
the radio circuit is a circuit for decoding and encoding the radio signal in a plurality of frequency bands;
the antenna has different two resonance frequencies in one of the frequency bands; and
the antenna includes a straight section and a helical section, the helical section having a two-resonance characteristic.

30. A portable radio apparatus in accordance with claim 27, further comprising:
a detector for detecting whether the antenna is in an expanded state in which the antenna is expanded; and
an expansion matching circuit impedance of which matches with the antenna in the expanded state in a particular frequency band when the expansion matching circuit is connected to the matching circuit; wherein:
the radio circuit is a circuit for decoding and encoding the radio signal in a plurality of frequency bands;
the antenna has different two resonance frequencies in one of the frequency bands;
the antenna includes a straight section and a helical section, the helical section having a two-resonance characteristic; and
the expansion matching circuit is connected to the matching circuit when the antenna is in the expanded state and a particular one of the frequency bands is selected.

31. A portable radio apparatus in accordance with claim 27, further comprising:
a detector for detecting whether the antenna is in an expanded state in which the antenna is expanded; and
an expansion matching circuit impedance of which matches with the antenna in the expanded state in a particular frequency band when the expansion matching circuit is connected to the matching circuit; wherein:
the radio circuit is a circuit for decoding and encoding the radio signal in a plurality of frequency bands;
the antenna has different two resonance frequencies in one of the frequency bands;
the antenna includes a straight section and a helical section, the helical section having a two-resonance characteristic;
the expansion matching circuit is connected to the matching circuit when the antenna is in the expanded state and a particular one of the frequency bands is selected; and
impedance of the antenna in the expanded state matches that of the matching circuit in a frequency band for which the expansion matching circuit is not connected to the matching circuit.

32. A portable radio apparatus in accordance with claim 1, wherein:
the matching circuit is a π type circuit in which a first inductive element is connected in parallel on the side of the antenna and a second inductive element is connected in parallel on the side of the radio circuit;
the first inductive element has a Q factor more than a Q factor of the second inductive element;
the Q factor of the first inductive element takes a value, which sets radiation efficiency of the antenna to a value equal to or more than a predetermined value when the radio signal is transmitted; and
the Q factor of each of the inductive elements is more than 40.

33. A portable radio apparatus in accordance with claim 32, wherein:
the radio circuit is a circuit for decoding and encoding the radio signal in a plurality of frequency bands; and
the antenna has different two resonance frequencies in one of the frequency bands.

34. A portable radio apparatus in accordance with claim 32, wherein:
the radio circuit is a circuit for decoding and encoding the radio signal in a plurality of frequency bands;
the antenna has different two resonance frequencies in one of the frequency bands; and the antenna includes a straight section and a helical section, the helical section having a two-resonance characteristic.

35. A portable radio apparatus in accordance with claim 32, further comprising:
a detector for detecting whether the antenna is in an expanded state in which the antenna is expanded; and
an expansion matching circuit impedance of which matches with the antenna in the expanded state in a particular frequency band when the expansion matching circuit is connected to the matching circuit;
wherein:
the radio circuit is a circuit for decoding and encoding the radio signal in a plurality of frequency bands;
the antenna has different two resonance frequencies in one of the frequency bands;
the antenna includes a straight section and a helical section, the helical section having a two-resonance characteristic; and
the expansion matching circuit is connected to the matching circuit when the antenna is in the expanded state and a particular one of the frequency bands is selected.

36. A portable radio apparatus in accordance with claim 32, further comprising:
a detector for detecting whether the antenna is in an expanded state in which the antenna is expanded; and
an expansion matching circuit impedance of which matches with the antenna in the expanded state in a particular frequency band when the expansion matching circuit is connected to the matching circuit;
wherein:
the radio circuit is a circuit for decoding and encoding the radio signal in a plurality of frequency bands;
the antenna has different two resonance frequencies in one of the frequency bands;
the antenna includes a straight section and a helical section, the helical section having a two-resonance characteristic;
the expansion matching circuit is connected to the matching circuit when the antenna is in the expanded state and a particular one of the frequency bands is selected; and
impedance of the antenna in the expanded state matches that of the matching circuit in a frequency band for which the expansion matching circuit is not connected to the matching circuit.

37. A portable radio apparatus in accordance with claim 1, wherein:
the matching circuit is a π type circuit in which a first inductive element is connected in parallel on the side of the antenna and a second inductive element is connected in parallel on the side of the radio circuit;
the first inductive element has a Q factor more than a Q factor of the second inductive element;
the Q factor of each of the first and second inductive elements takes a value, which sets radiation efficiency of the antenna to a value equal to or more than a predetermined value when the radio signal is transmitted; and
the Q factor of each of the inductive elements is more than 40.

38. A portable radio apparatus in accordance with claim 37, wherein:
the radio circuit is a circuit for decoding and encoding the radio signal in a plurality of frequency bands; and
the antenna has different two resonance frequencies in one of the frequency bands.

39. A portable radio apparatus in accordance with claim 37, wherein:
the radio circuit is a circuit for decoding and encoding the radio signal in a plurality of frequency bands;
the antenna has different two resonance frequencies in one of the frequency bands; and
the antenna includes a straight section and a helical section, the helical section having a two-resonance characteristic.

40. A portable radio apparatus in accordance with claim 37, further comprising:
a detector for detecting whether the antenna is in an expanded state in which the antenna is expanded; and
an expansion matching circuit impedance of which matches with the antenna in the expanded state in a particular frequency band when the expansion matching circuit is connected to the matching circuit;
wherein:
the radio circuit is a circuit for decoding and encoding the radio signal in a plurality of frequency bands;
the antenna has different two resonance frequencies in one of the frequency bands;
the antenna includes a straight section and a helical section, the helical section having a two-resonance characteristic; and
the expansion matching circuit is connected to the matching circuit when the antenna is in the expanded state and a particular one of the frequency bands is selected.

41. A portable radio apparatus in accordance with claim 37, further comprising:
a detector for detecting whether the antenna is in an expanded state in which the antenna is expanded; and
an expansion matching circuit impedance of which matches with the antenna in the expanded state in a particular frequency band when the expansion matching circuit is connected to the matching circuit;
wherein:
the radio circuit is a circuit for decoding and encoding the radio signal in a plurality of frequency bands;
the antenna has different two resonance frequencies in one of the frequency bands;
the antenna includes a straight section and a helical section, the helical section having a two-resonance characteristic;
the expansion matching circuit is connected to the matching circuit when the antenna is in the expanded state and a particular one of the frequency bands is selected; and
impedance of the antenna in the expanded state matches that of the matching circuit in a frequency band for which the expansion matching circuit is not connected to the matching circuit.

42. A portable radio apparatus in accordance with claim 1, wherein:
the radio circuit is a circuit for decoding and encoding the radio signal in a plurality of frequency bands; and
the antenna has different two resonance frequencies in one of the frequency bands.

43. A portable radio apparatus in accordance with claim 1, wherein:
the radio circuit is a circuit for decoding and encoding the radio signal in a plurality of frequency bands;
the antenna has different two resonance frequencies in one of the frequency bands; and
the antenna includes a straight section and a helical section, the helical section having a two-resonance characteristic.

44. A portable radio apparatus in accordance with claim 1, further comprising:
- a detector for detecting whether the antenna is in an expanded state in which the antenna is expanded; and
- an expansion matching circuit impedance of which matches with the antenna in the expanded state in a particular frequency band when the expansion matching circuit is connected to the matching circuit; wherein:
- the radio circuit is a circuit for decoding and encoding the radio signal in a plurality of frequency bands;
- the antenna has different two resonance frequencies in one of the frequency bands;
- the antenna includes a straight section and a helical section, the helical section having a two-resonance characteristic; and
- the expansion matching circuit is connected to the matching circuit when the antenna is in the expanded state and a particular one of the frequency bands is selected.

45. A portable radio apparatus in accordance with claim 1, further comprising:
- a detector for detecting whether the antenna is in an expanded state in which the antenna is expanded; and
- an expansion matching circuit impedance of which matches with the antenna in the expanded state in a particular frequency band when the expansion matching circuit is connected to the matching circuit; wherein:
- the radio circuit is a circuit for decoding and encoding the radio signal in a plurality of frequency bands;
- the antenna has different two resonance frequencies in one of the frequency bands;
- the antenna includes a straight section and a helical section, the helical section having a two-resonance characteristic;
- the expansion matching circuit is connected to the matching circuit when the antenna is in the expanded state and a particular one of the frequency bands is selected; and
- impedance of the antenna in the expanded state matches that of the matching circuit in a frequency band for which the expansion matching circuit is not connected to the matching circuit.

46. A portable radio apparatus comprising:
- an antenna for transmitting and receiving a radio signal;
- a radio circuit for decoding the radio signal received via the antenna and encoding a signal to be transmitted as a radio signal via the antenna;
- a matching circuit for providing an impedance match between the antenna and the radio circuit, the matching circuit including at least one capacitive element connected in parallel to the antenna;
- a detector for detecting whether the antenna is in an expanded state in which the antenna is expanded; and
- an expansion matching circuit impedance of which matches with the antenna in the expanded state in a particular frequency band when the expansion matching circuit is connected to the matching circuit; wherein:
- the radio circuit is a circuit for decoding and encoding the radio signal in a plurality of frequency bands;
- the antenna has different two resonance frequencies in one of the frequency bands;
- the antenna includes a straight section and a helical section, the helical section having a two-resonance characteristic; and
- the expansion matching circuit is connected to the matching circuit when the antenna is in the expanded state and a particular one of the frequency bands is selected.

47. A portable radio apparatus in accordance with claim 46, wherein
- impedance of the antenna in the expanded state matches that of the matching circuit in a frequency band for which the expansion matching circuit is not connected to the matching circuit.

* * * * *